(12) United States Patent
Toyama

(10) Patent No.: US 11,532,773 B2
(45) Date of Patent: Dec. 20, 2022

(54) SEMICONDUCTOR LIGHT EMITTING DEVICE

(71) Applicant: ROHM CO., LTD., Kyoto (JP)

(72) Inventor: Tomoichiro Toyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 126 days.

(21) Appl. No.: 17/230,379

(22) Filed: Apr. 14, 2021

(65) Prior Publication Data

US 2021/0234077 A1 Jul. 29, 2021

Related U.S. Application Data

(63) Continuation of application No. 16/807,361, filed on Mar. 3, 2020, now Pat. No. 11,011,686.

(30) Foreign Application Priority Data

Mar. 27, 2019 (JP) .............................. JP2019-060989

(51) Int. Cl.
*H01L 33/54* (2010.01)
*H01L 23/00* (2006.01)
*H01L 33/62* (2010.01)

(52) U.S. Cl.
CPC .............. *H01L 33/54* (2013.01); *H01L 24/48* (2013.01); *H01L 33/62* (2013.01);
(Continued)

(58) Field of Classification Search
CPC ......... H01L 33/54; H01L 24/48; H01L 33/62; H01L 2224/48245; H01L 2924/12041;
(Continued)

(56) References Cited

U.S. PATENT DOCUMENTS

2015/0294959 A1  10/2015  Lee et al.

FOREIGN PATENT DOCUMENTS

JP    H09181359 A    7/1997
JP    2000323754 A    11/2000
(Continued)

OTHER PUBLICATIONS

Notice of Reasons for Refusal issued in corresponding Japanese application No. 2019-060989, dated Sep. 20, 2022, with English machine translation.

*Primary Examiner* — Robert G Bachner
(74) *Attorney, Agent, or Firm* — Hamre, Schumann, Mueller & Larson, P.C.

(57) ABSTRACT

Semiconductor light emitting device includes: substrate including main and back surfaces, first and second side surfaces, and bottom and top surfaces, wherein main surface includes first to fourth sides; first main surface electrode on main surface and including first base portion contacting the sides of the main surface, and die pad connected to first base portion; second main surface electrode disposed on the main surface and including second base portion contacting first and third sides of the main surface, and wire pad connected to second base portion; semiconductor light emitting element including first electrode pad and mounted on die pad; wire connecting first electrode pad and wire pad; first insulating film covering portion between first base portion and die pad; second insulating film covering portion between second base portion and wire pad and having end portions contacting main surface; and light-transmitting sealing resin.

12 Claims, 39 Drawing Sheets

(52) U.S. Cl.
CPC ............... *H01L 2224/48245* (2013.01); *H01L 2924/12041* (2013.01); *H01L 2924/35121* (2013.01)

(58) Field of Classification Search
CPC ........... H01L 2924/35121; H01L 24/05; H01L 24/29; H01L 24/32; H01L 24/73; H01L 24/83; H01L 24/85; H01L 2224/04042; H01L 2224/05555; H01L 2224/2929; H01L 2224/29339; H01L 2224/32245; H01L 2224/48247; H01L 2224/48471; H01L 2224/73265; H01L 2224/83455; H01L 2224/83464; H01L 2224/8385; H01L 2224/85455; H01L 2224/85464; H01L 2924/00014; H01L 2924/181; H05K 3/363; H05K 3/366; H05K 3/403; H05K 2201/049; H05K 2201/10106; H05K 2203/1316
See application file for complete search history.

(56) References Cited

FOREIGN PATENT DOCUMENTS

| | | | |
|---|---|---|---|
| JP | 2005039177 | A | 2/2005 |
| JP | 2012169326 | A | 9/2012 |
| JP | 2013069731 | A | 4/2013 |
| JP | 2015225917 | A | 12/2015 |
| JP | 2018107207 | A | 7/2018 |

SEMICONDUCTOR LIGHT EMITTING DEVICE

CROSS-REFERENCE TO RELATED APPLICATION

This application is continuation application of U.S. application Ser. No. 16/807,361, which was based upon and claims the benefit of priority from Japanese Patent Application No. 2019-060989, filed on Mar. 27, 2019, the entire contents of which are incorporated herein by reference.

TECHNICAL FIELD

The present disclosure relates to a semiconductor light emitting device.

BACKGROUND

An LED module on which an LED chip that emits desired light is mounted is known in the related art. The LED module known in the related art is a so-called side view type LED module that emits light in parallel with a circuit board on which the LED module is mounted. Such an LED module includes an LED chip mounted on a die pad of a substrate, a wire that connects the LED chip and a pad of the substrate, and a sealing resin that seals the LED chip and the wire. The die pad and the pad are respectively connected to electrodes for mounting the LED module on the circuit board.

Due to the recent demand for further downsizing of electronic apparatuses, further downsizing of LED packages is required. However, if an electrode of a substrate and a sealing resin for sealing an LED chip are close to each other due to downsizing, a solder for mounting an LED module on a circuit board may penetrate into the inside from between the electrode and the sealing resin. Such solder penetration causes problems such as peeling of the LED chip and a wire from a pad.

SUMMARY

Some embodiments of the present disclosure provide a semiconductor light emitting device capable of suppressing an occurrence of defects due to penetration of solder.

According to one embodiment of the present disclosure, there is provided a semiconductor light emitting device. The semiconductor light emitting device includes: a substrate including a main surface and a back surface facing opposite sides in a thickness direction of the substrate, a first side surface and a second side surface facing opposite sides in a first direction perpendicular to the thickness direction, and a bottom surface and a top surface facing opposite sides in a second direction perpendicular to the thickness direction and the first direction, wherein the main surface includes a first side on the side of the bottom surface, a second side on the side of the first side surface, a third side on the side of the second side surface, and a fourth side on the side of the top surface; a first main surface electrode that is disposed on the main surface and includes a first base portion in contact with both the first side and the second side of the main surface, and a die pad connected to the first base portion; a second main surface electrode that is disposed on the main surface and includes a second base portion in contact with both the first side and the third side of the main surface, and a wire pad connected to the second base portion; a semiconductor light emitting element that includes a first electrode pad and is mounted on the die pad; a wire connecting the first electrode pad and the wire pad; a first insulating film that covers a portion between the first base portion and the die pad and has both end portions in contact with the main surface; a second insulating film that covers a portion between the second base portion and the wire pad and has both end portions in contact with the main surface; and a light-transmitting sealing resin covering the main surface, the first main surface electrode, the second main surface electrode, the semiconductor light emitting element, the wire, the first insulating film, and the second insulating film.

With this configuration, solder attached to the first through electrode connected to the first base portion is unlikely to penetrate between the first base portion and the first insulating film. Therefore, since the penetration of solder into the semiconductor light emitting device from between the first main surface electrode and the first insulating film is suppressed, it is possible to suppress an occurrence of a defect that the semiconductor light emitting element is separated from the die pad. Similarly to the first insulating film, since the penetration of solder into the semiconductor light emitting device from between the second main surface electrode and the second insulating film is suppressed, it is possible to suppress the occurrence of a defect that the wire is separated from the wire pad.

DETAILED DESCRIPTION

Embodiments of a semiconductor light emitting device will be now described with reference to the drawings. The following embodiments exemplify a configuration and method for embodying the technical idea of the present disclosure, and do not limit a material, a shape, a structure, an arrangement, a dimension, and the like of each constituent part of the present disclosure. Various modifications may be made to the following embodiments.

In the present disclosure, "a state where a member A is connected to a member B" includes a case where the member A and the member B are physically directly connected or even a case where the member A and the member B are indirectly connected through any other member that does not affect an electrical connection state between the members A and B or does not impair functions and effects achieved by combinations of the members A and B.

In the present disclosure, the terms "first," "second," "third," and the like are merely used as labels, and are not necessarily intended to subject their objects to permutation.

First Embodiment

Hereinafter, a semiconductor light emitting device according to a first embodiment of the present disclosure will be described with reference to FIGS. 1 to 11.

Figure 1:
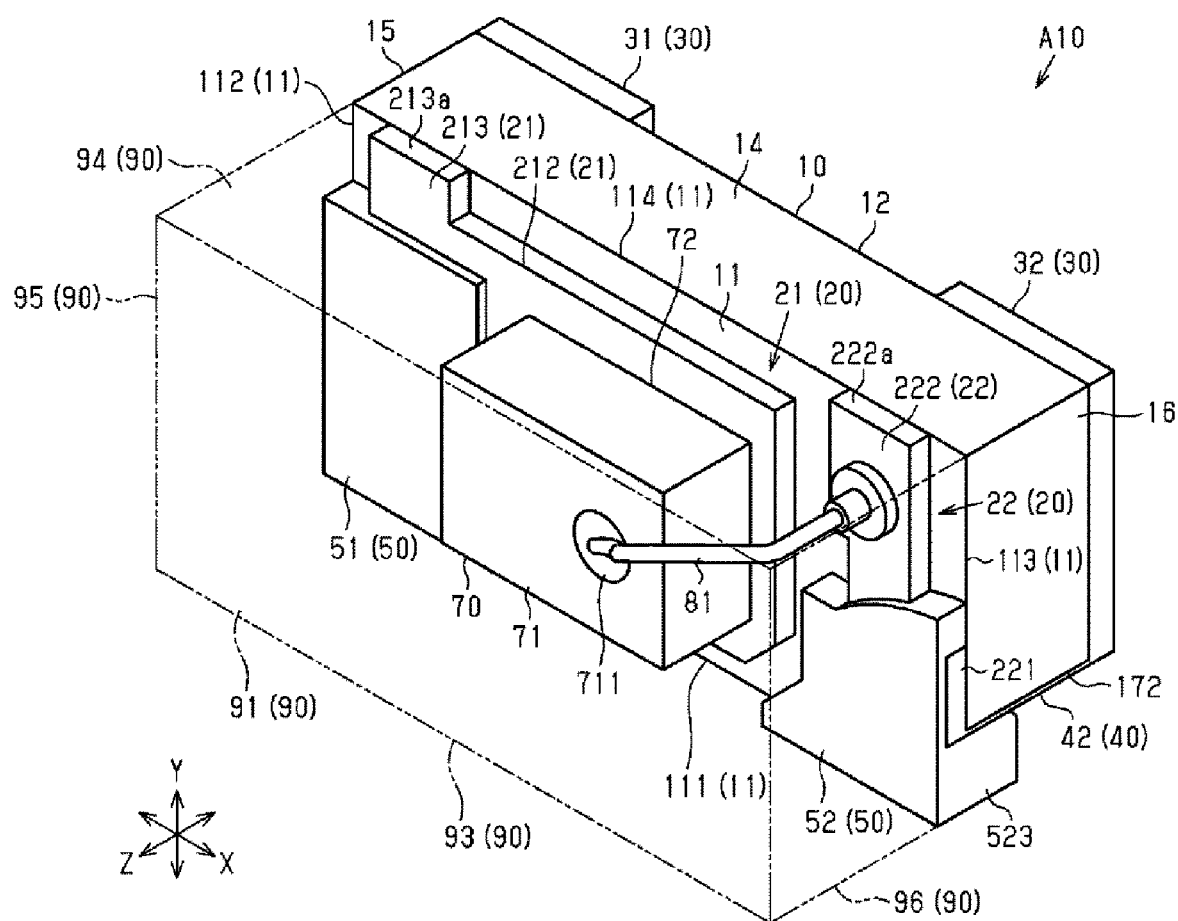
FIG. 1 is a perspective view of a semiconductor light emitting device, when viewed from a front upper right side, according to a first embodiment of the present disclosure.
Figure 2:
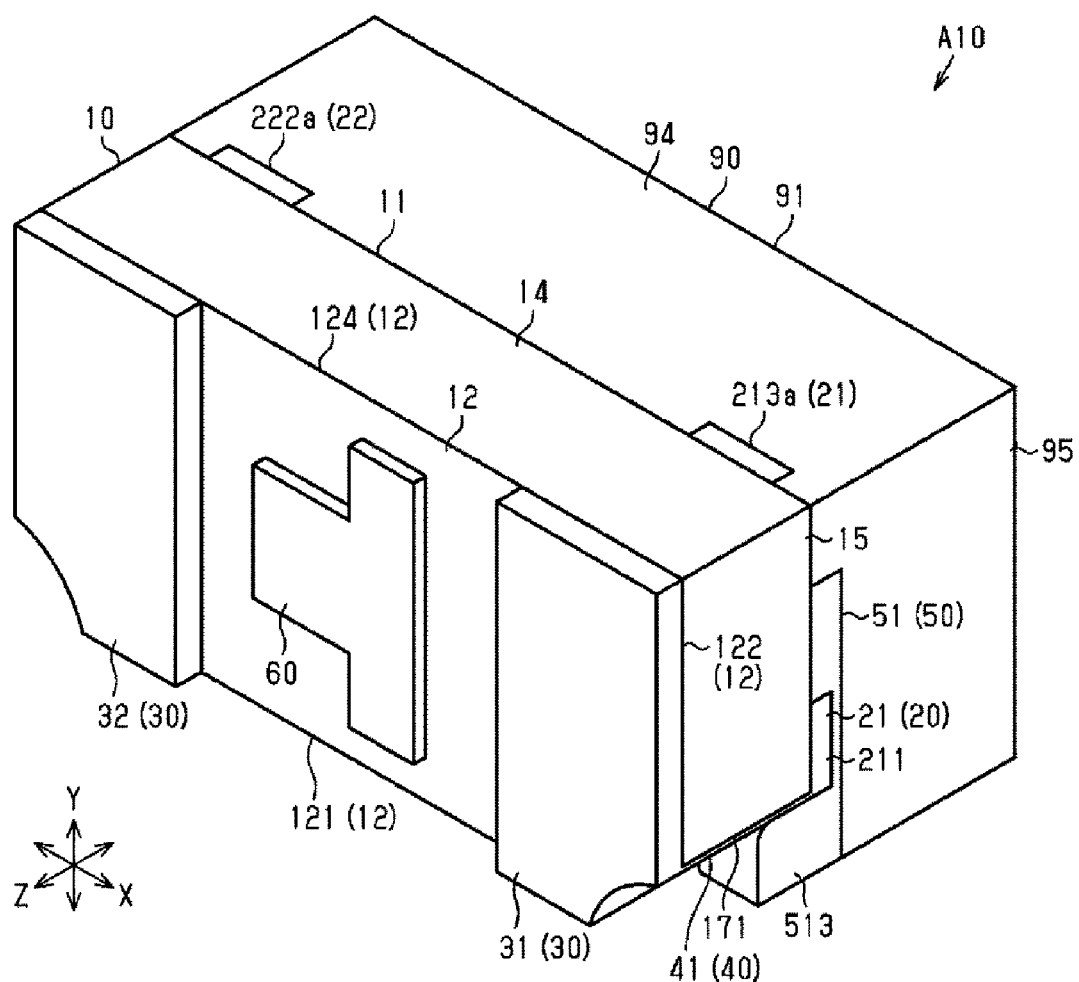
FIG. 2 is a perspective view of the semiconductor light emitting device, when viewed from a rear upper left side, according to the first embodiment.
Figure 3:
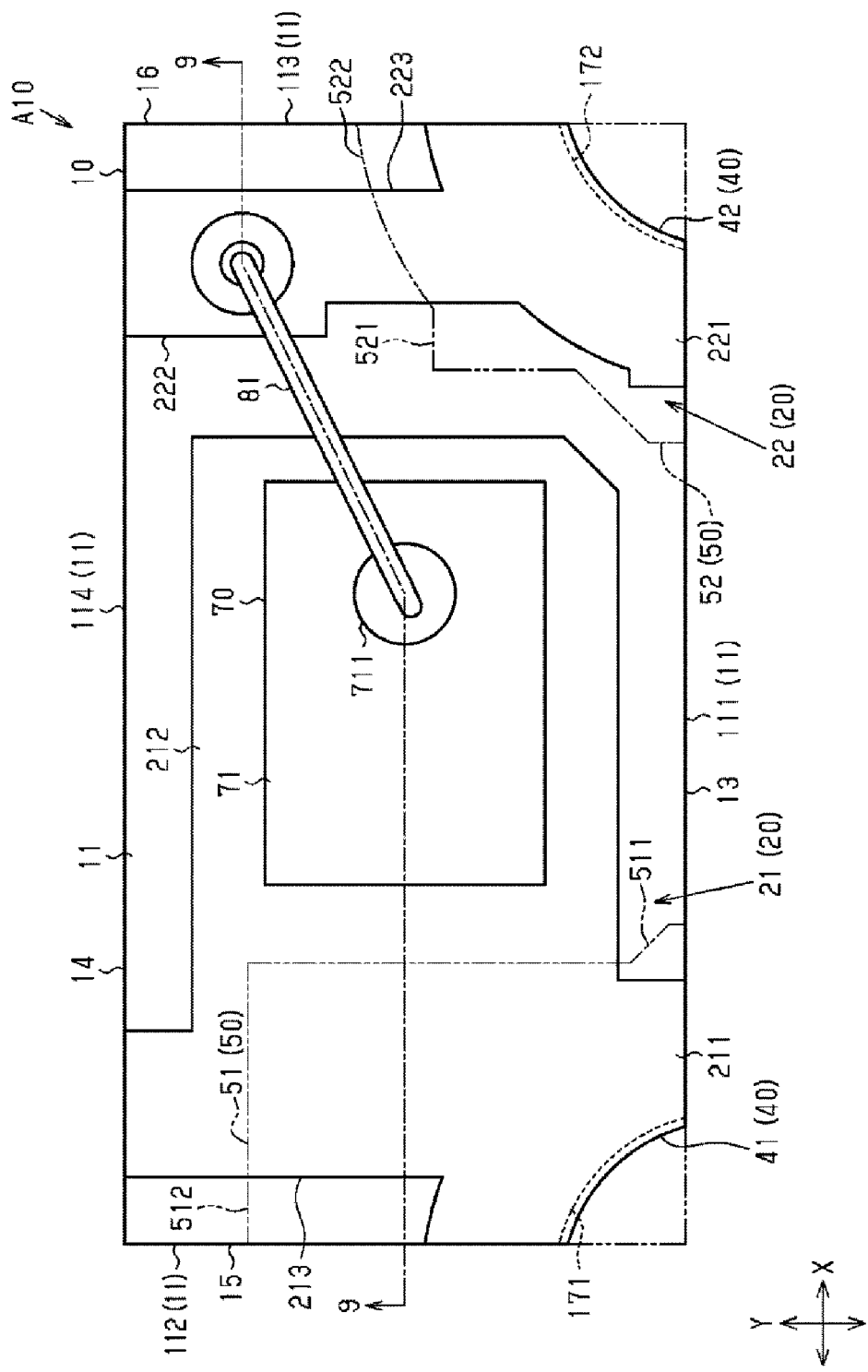
FIG. 3 is a front view of the semiconductor light emitting device according to the first embodiment.

As shown in FIGS. 1 to 9, a semiconductor light emitting device A10 includes a substrate 10, a main surface electrode 20, a back surface electrode 30, a through electrode 40, a main surface insulating film 50, a back surface insulating film 60, a semiconductor light emitting element 70, a wire 81, and a sealing resin 90. In FIGS. 1 and 5 to 8, the sealing resin is indicated by a two-dot chain line for convenience of understanding. In FIG. 3, for convenience of understanding, the sealing resin is omitted, and the main surface insulating film 50 is indicated by a two-dot chain line.

Figure 10:
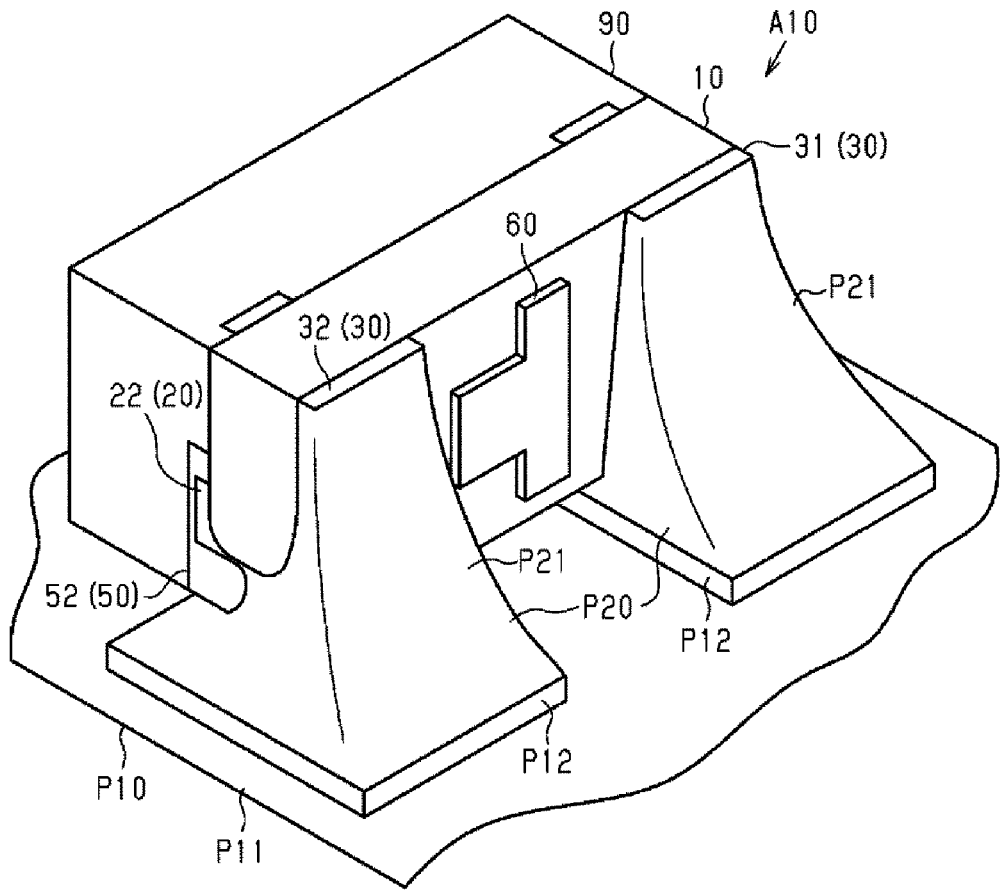
FIG. 10 is a perspective view showing a mounting state of the semiconductor light emitting device according to the first embodiment.
Figure 11:
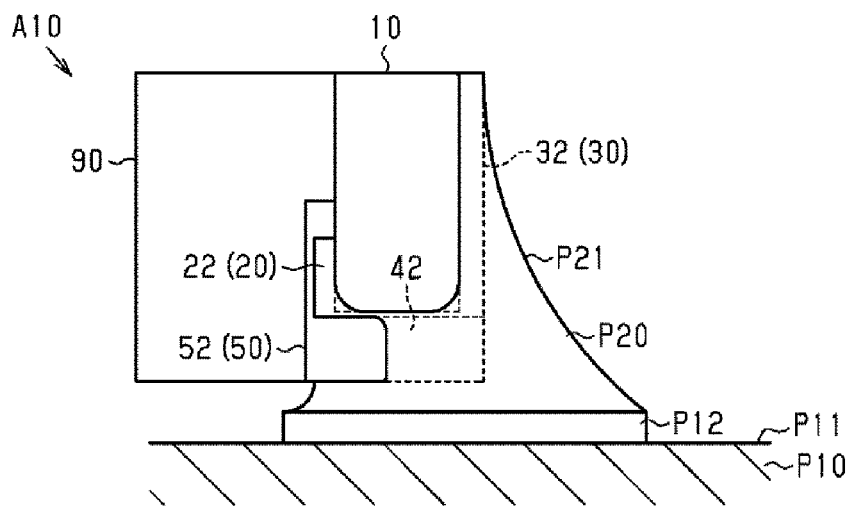
FIG. 11 is a right side view showing a mounting state of the semiconductor light emitting device according to the first embodiment.

The semiconductor light emitting device A10 is mounted on a circuit board P10 shown in FIGS. 10 and 11. The semiconductor light emitting device A10 is a side view type semiconductor light emitting device having an optical axis in a direction (the left direction in FIG. 11) parallel to an upper surface P11 of the circuit board P10 on which the semiconductor light emitting device is mounted.

As shown in FIGS. 1, 2 and 3, a shape of the semiconductor light emitting device A10 is rectangular as viewed from a thickness direction Z of the substrate of the semiconductor light emitting device A10. Here, for convenience of explanation, a long side direction of the semiconductor light emitting device A10 perpendicular to the thickness direction Z of the substrate 10 of the semiconductor light emitting device A10 is defined as a first direction X, and a direction of a short side direction of the semiconductor light emitting device A10 perpendicular to both of the thickness direction Z and the first direction X is defined as a second direction Y.

The substrate 10 is a member for mounting the semiconductor light emitting element 70 thereon and mounting the semiconductor light emitting device A10 on the circuit board P10. The substrate 10 is made of a material having electrical insulation. An example of the material may include glass epoxy resin.

The substrate 10 has a rectangular shape having its long side in the first direction X. The substrate 10 includes a main surface 11, a back surface 12, a bottom surface 13, a top surface 14, a first side surface 15, and a second side surface 16. The main surface 11 and the back surface 12 face opposite sides to each other in the thickness direction Z. The bottom surface 13 and the top surface 14 face opposite sides in the second direction Y. The first side surface 15 and the second side surface 16 face opposite sides in the first direction X.

As shown in FIG. 3, the main surface 11 includes a first side 111, a second side 112, a third side 113, and a fourth side 114. The first side 111 and the fourth side 114 are sides that extend along the first direction X and are separated from each other in the second direction Y. The second side 112 and the third side 113 are sides that extend along the second direction Y and are separated from each other in the first direction X. In the first direction X, the third side 113 is located on a side opposite to the second side. One end of the fourth side 114 intersects the second side 112, and the other end of the fourth side 114 intersects the third side 113.

Figure 4:
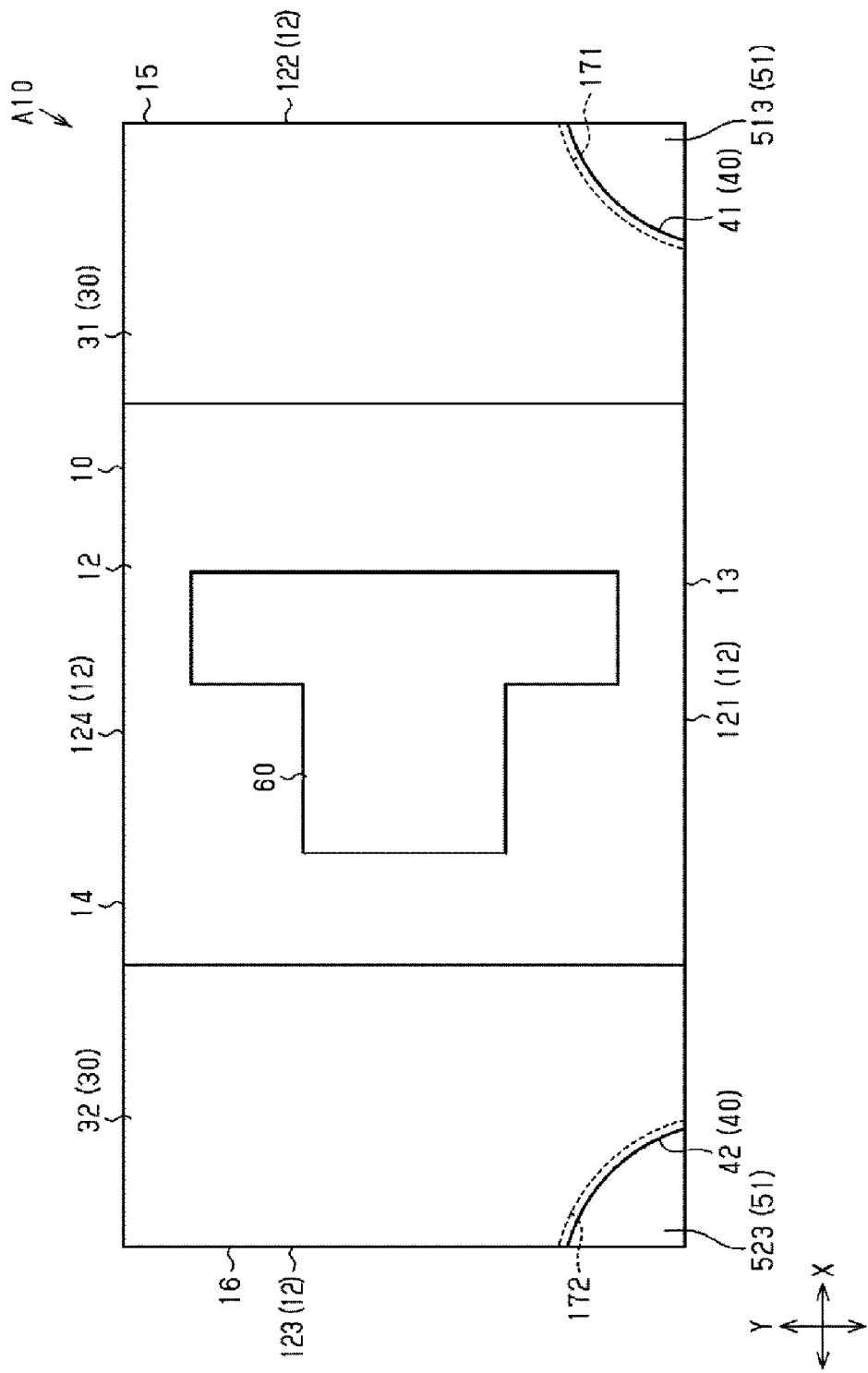
FIG. 4 is a rear view of the semiconductor light emitting device according to the first embodiment.
Figure 8:
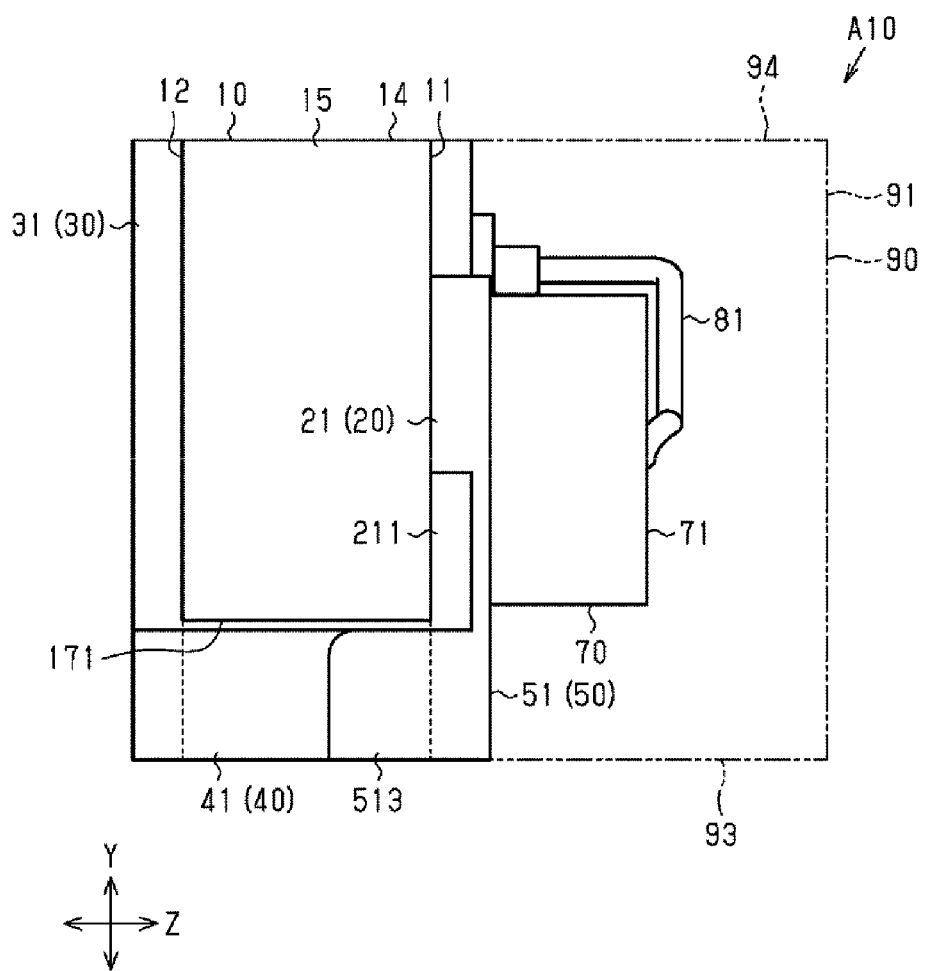
FIG. 8 is a left side view of the semiconductor light emitting device according to the first embodiment.

As shown in FIGS. 3 and 4, the substrate 10 includes a first through groove 171 and a second through groove 172. As shown in FIG. 3, the first through groove 171 is a portion recessed from the first side surface 15 and the bottom surface 13. The first through groove 171 is connected to the first side 111 and the second side 112 of the main surface 11. As shown in FIG. 8, the first through groove 171 reaches the main surface 11 and the back surface 12 of the substrate 10 in the thickness direction Z. A cross section of the first through groove 171 perpendicular to the thickness direction Z has a quarter circular shape. A first through electrode 41 is disposed in the first through groove 171.

Figure 7:
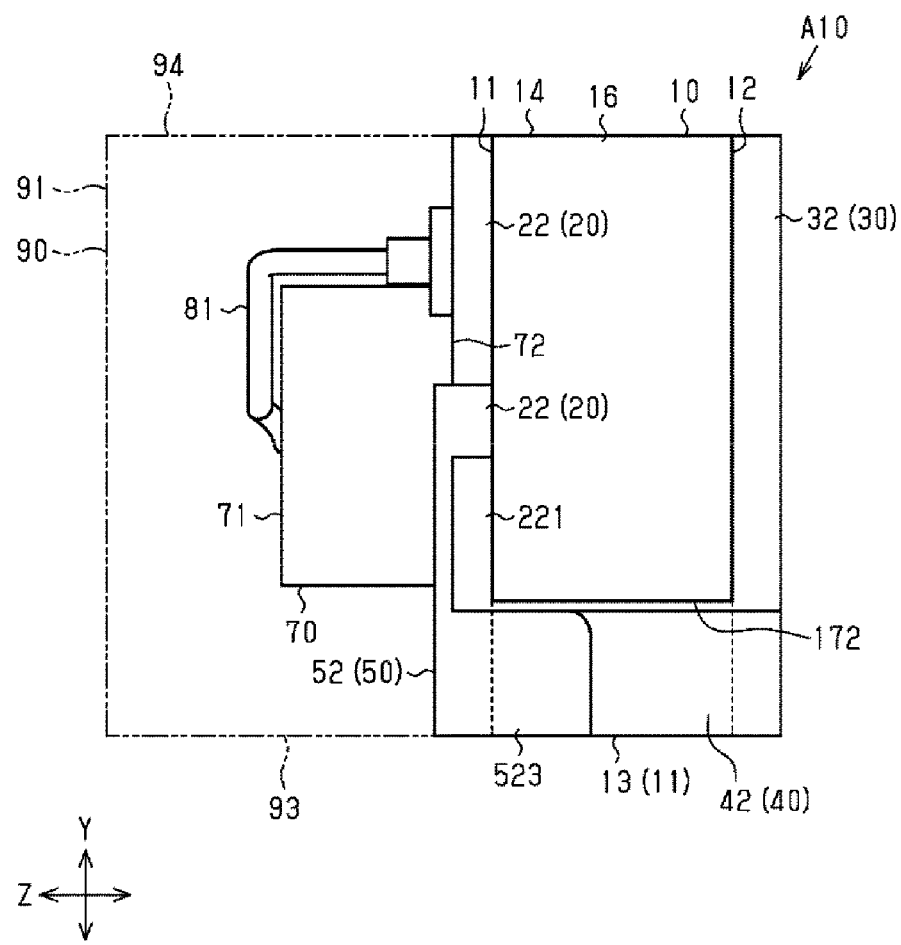
FIG. 7 is a right side view of the semiconductor light emitting device according to the first embodiment.

As shown in FIG. 3, the second through groove 172 is a portion recessed from the second side surface 16 and the bottom surface 13. The second through groove 172 is connected to the first side 111 and the third side 113 of the main surface 11. As shown in FIG. 7, the second through groove 172 reaches the main surface 11 and the back surface 12 of the substrate 10 in the thickness direction Z. The cross section of the second through groove 172 perpendicular to the thickness direction Z has a quarter circular shape. A second through electrode 42 is disposed in the second through groove 172.

As shown in FIGS. 1 and 3, the main surface electrode 20 is disposed on the main surface 11 of the substrate 10. The main surface electrode 20 is a conductive member for electrically connecting the semiconductor light emitting element 70 mounted on the main surface electrode 20 to the circuit board P10 shown in FIGS. 10 and 11.

The main surface electrode 20 includes a first main surface electrode 21 and a second main surface electrode 22. The first main surface electrode 21 includes a first base portion 211, a die pad 212, and a connection portion 213. The first base portion 211 is a portion in contact with both of the first side 111 on the side of the bottom surface 13 of the substrate 10 and the second side 112 on the side of the first side surface 15 of the substrate 10 on the main surface 11 of the substrate 10. In the present embodiment, the first base portion 211 has an annular shape with a central angle of 90 degrees (quarter annular shape). The inner edge of the first base portion 211 intersects the first through groove 171 connected to the first side 111 and the second side 112 of the main surface 11.

Figure 5:
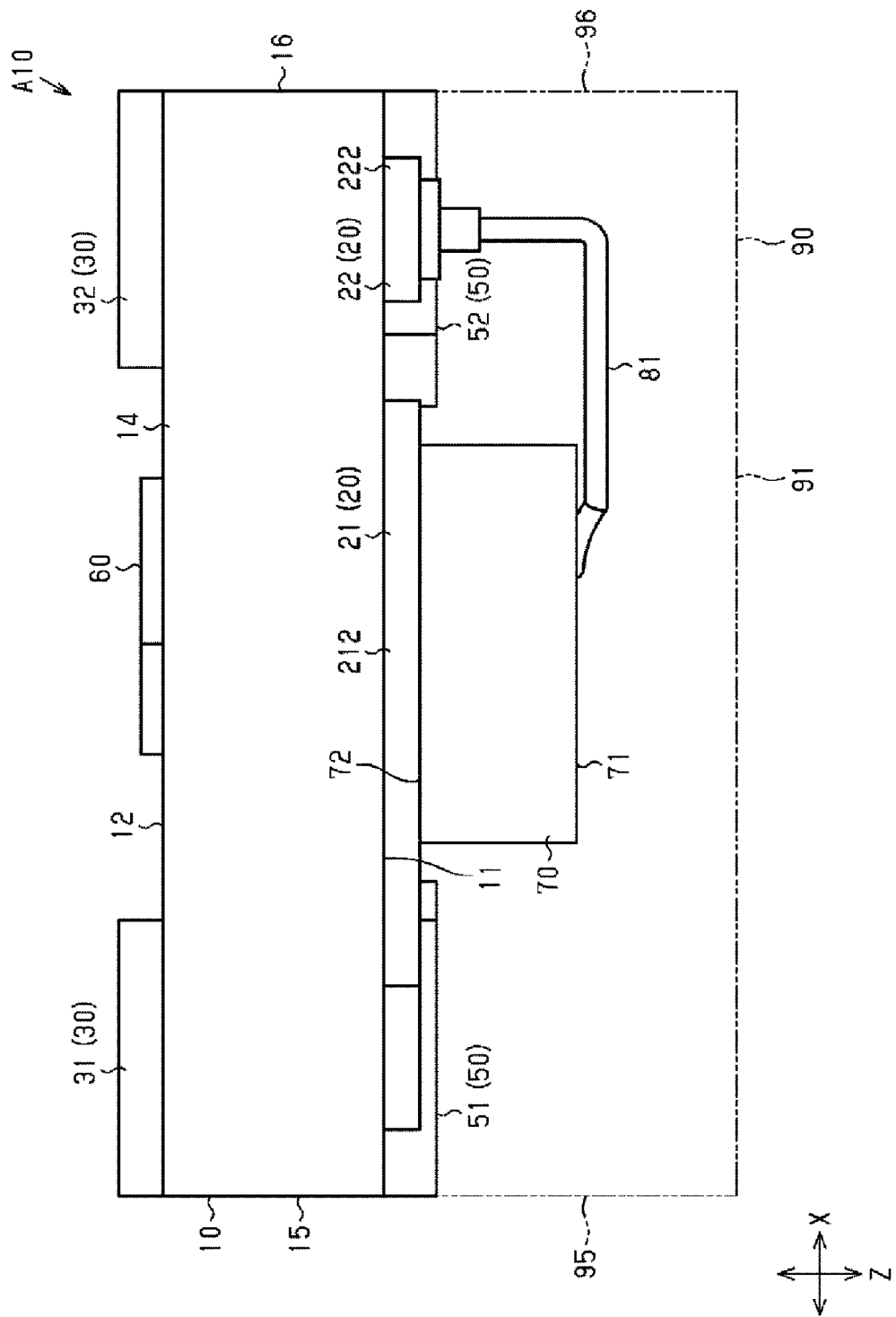
FIG. 5 is a top view of the semiconductor light emitting device according to the first embodiment.
Figure 6:
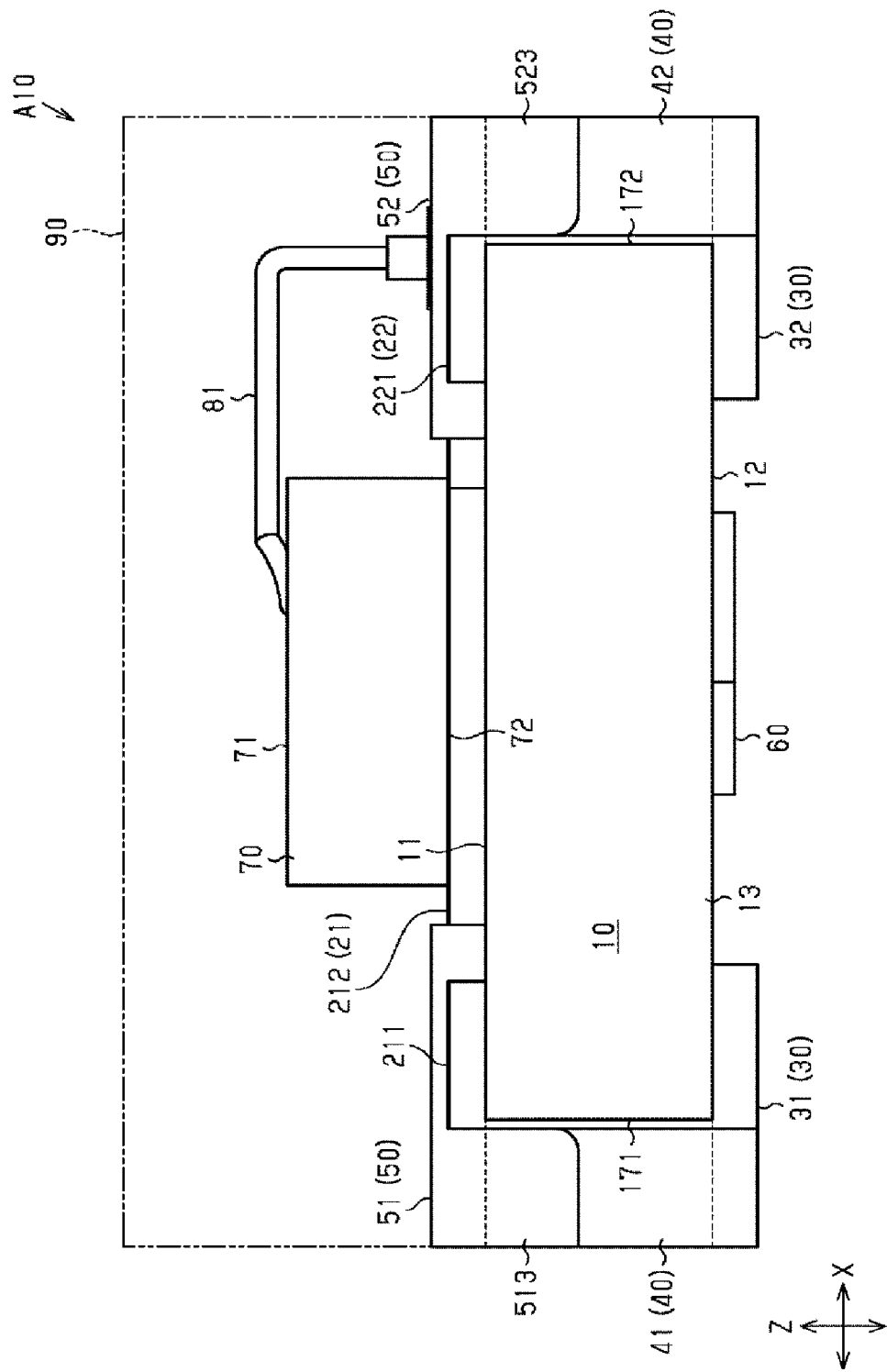
FIG. 6 is a bottom view of the semiconductor light emitting device according to the first embodiment.

The die pad 212 has a quadrangular shape. The semiconductor light emitting element 70 is mounted on the die pad 212. The die pad 212 is connected to the first base portion 211 via the connection portion 213. The connection portion 213 extends from the first base portion 211 in a transverse direction of the substrate 10, that is, in the second direction Y. The connection portion 213 is in contact with the fourth side 114 of the main surface 11 of the substrate 10. As shown in FIG. 5, the end surface 213a of the connection portion 213 is exposed from the sealing resin 90 on the top surface 14 side of the substrate 10.

The second main surface electrode 22 includes a second base part 221, a wire pad 222, and a connection portion 223. The second base portion 221 is a portion in contact with both of the first side 111 on the side of the bottom surface 13 of the substrate 10 and the third side 113 on the side of the second side surface 16 of the substrate 10 on the main surface 11 of the substrate 10. In the present embodiment, the second base portion 221 has an annular shape with a central angle of 90 degrees (quarter annular shape). The inner edge of the second base portion 221 intersects the second through groove 172 connected to the first side 111 and the third side 113 of the main surface 11.

The wire pad 222 has a quadrangular shape. The wire 81 connected to the electrode of the semiconductor light emitting element 70 is connected to the wire pad 222. In the present embodiment, the wire pad 222 is in contact with the fourth side 114 of the main surface 11 of the substrate 10. As shown in FIG. 5, the end surface 222a of the wire pad 222 is exposed from the sealing resin 90 on the top surface 14 side of the substrate 10. The wire pad 222 is connected to the second base portion 221 via the connection portion 223. The connection portion 223 extends from the second base portion 221 in the transverse direction of the substrate 10, that is, in the second direction Y. The width of the connection portion 223 in the first direction X is smaller than the width of the wire pad 222 in the first direction X.

As shown in FIGS. 2 and 4, the back surface electrode 30 is disposed on the back surface 12 of the substrate 10. The back surface electrode 30 includes a first back surface electrode 31 and a second back surface electrode 32. The first back surface electrode 31 and the second back surface electrode 32 are spaced apart in the first direction X. The first back surface electrode 31 is disposed on the first side surface 15 side of the substrate 10 on the back surface 12 of the substrate 10, and the second back surface electrode 32 is disposed on the second side surface 16 side of the substrate 10 on the back surface 12 of the substrate 10.

As shown in FIG. 4, the first back surface electrode 31 is in contact with the first side 121 and the second side 122 on the back surface 12 of the substrate 10. A portion of the edge of the first back surface electrode 31 intersects the first through groove 171. The second back surface electrode 32 is in contact with the first side 121 and the third side 123 on the back surface 12 of the substrate 10. A portion of the edge of the second back surface electrode 32 intersects the second through groove 172. The first back surface electrode 31 and the second back surface electrode 32 extend to the fourth side 124 on the side of the top surface 14 of the substrate 10 on the back surface 12 of the substrate 10. As shown in FIGS. 3 and 4, the first through electrode 41 is disposed along an inner wall of the first through groove 171. As shown in FIG. 8, the first through electrode 41 extends to the main surface 11 of the substrate 10 and is in contact with the first main surface electrode 21 of the main surface 11. In addition, the first through electrode 41 extends to the back surface 12 of the substrate 10 and is in contact with the first back surface electrode 31 on the back surface 12. Therefore, the first through electrode 41 electrically connects the first main surface electrode 21 and the first back surface electrode 31.

As shown in FIGS. 3 and 4, the second through electrode 42 is disposed along the inner wall of the second through groove 172. As shown in FIG. 7, the second through electrode 42 extends to the main surface 11 of the substrate 10 and is in contact with the second main surface electrode 22 of the main surface 11. In addition, the second through electrode 42 extends to the back surface 12 of the substrate 10 and is in contact with the second back surface electrode 32 on the back surface 12. Therefore, the second through electrode 42 electrically connects the second main surface electrode 22 and the second back surface electrode 32.

As shown in FIG. 3, the main surface insulating film 50 is a member that covers a portion of the main surface electrode 20 on the main surface 11 of the substrate 10. The main surface insulating film 50 includes a first insulating film 51 that covers a portion of the first main surface electrode 21, and a second insulating film 52 that covers a portion of the second main surface electrode 22. The main surface insulating film 50 is made of an insulating resin material. The main surface insulating film 50 is a resist layer and is referred to as a solder resist layer. The main surface insulating film 50 is formed on the main surface 11 of the substrate 10 by, for example, pressing, attaching, and curing a film-like resist. The main surface insulating film 50 may be formed using a liquid resist.

The first insulating film 51 covers the entire surface of the first base portion 211 and a partial surface of the connection portion 213 of the first main surface electrode 21. Further, the first insulating film 51 is in contact with the second side 112 of the main surface 11 of the substrate 10 and is also in contact with the first side 111 of the main surface 11 of the substrate 10. Accordingly, the first insulating film 51 straddles the first main surface electrode 21 including the first base portion 211 in contact with the first side 111 and the second side 112 of the main surface 11 of the substrate 10 such that both end portions 511 and 512 thereof are in contact with the main surface 11 of the substrate 10.

In addition, as shown in FIG. 8, the first insulating film 51 of the present embodiment has a resin portion 513 that enters the first through groove 171. The resin portion 513 covers a portion where the first base portion 211 of the first main surface electrode 21 and the first through electrode 41 are connected.

As shown in FIG. 3, the second insulating film 52 covers the entire surface of the second base portion 221 of the second main surface electrode 22 and a partial surface of the connection portion 223. Further, the second insulating film 52 is in contact with the third side 113 of the main surface 11 of the substrate 10 and is also in contact with the first side 111 of the main surface 11 of the substrate 10. Accordingly, the second insulating film 52 straddles the second main surface electrode 22 including the second base portion 221 in contact with the first side 111 and the third side 113 of the main surface 11 of the substrate 10, so that both end portions 521 and 522 thereof are in contact with the main surface 11 of the substrate 10.

In addition, as shown in FIG. 7, the second insulating film 52 of the present embodiment includes a resin portion 523 that enters the second through groove 172. The resin portion 523 covers a portion where the second base portion 221 of the second main surface electrode 22 and the second through electrode 42 are connected.

The back surface insulating film 60 is disposed on the back surface 12 of the substrate 10. The back surface insulating film 60 is made of an insulating resin material. The back surface insulating film 60 is a resist layer. The back surface insulating film 60 functions as a mark for determining the connection direction of the semiconductor light emitting device A10. The back surface insulating film 60 is in the vicinity of the center of the back surface 12 in the first direction X, and is interposed between the first back surface electrode 31 and the second back surface electrode 32. When viewed from the thickness direction Z, the back surface insulating film 60 has a convex shape in which the second back surface electrode 32 side protrudes in the first direction X. The back surface insulating film 60 having such a shape functions as a mark for determining the connection direction of the semiconductor light emitting device A10. The back surface insulating film 60 is formed by curing a film-like resist attached to the back surface 12 of the substrate 10. The back surface insulating film 60 may be formed using a liquid resist.

The semiconductor light emitting element 70 is, for example, a light emitting diode (LED) element. The semiconductor light emitting element 70 may be a light emitting element such as an LD. As shown in FIG. 3, the semiconductor light emitting element 70 has a substantially rectangular parallelepiped shape. The semiconductor light emitting element 70 includes a main surface 71 and a back surface 72 that face opposite sides in the thickness direction Z. The main surface 71 is a surface facing the same direction as the main surface 11 of the substrate 10, and the back surface 72 is a surface facing the die pad 212. The semiconductor light emitting element 70 includes an electrode pad 711 on the main surface 71 and an electrode on the back surface 72.

Figure 9:
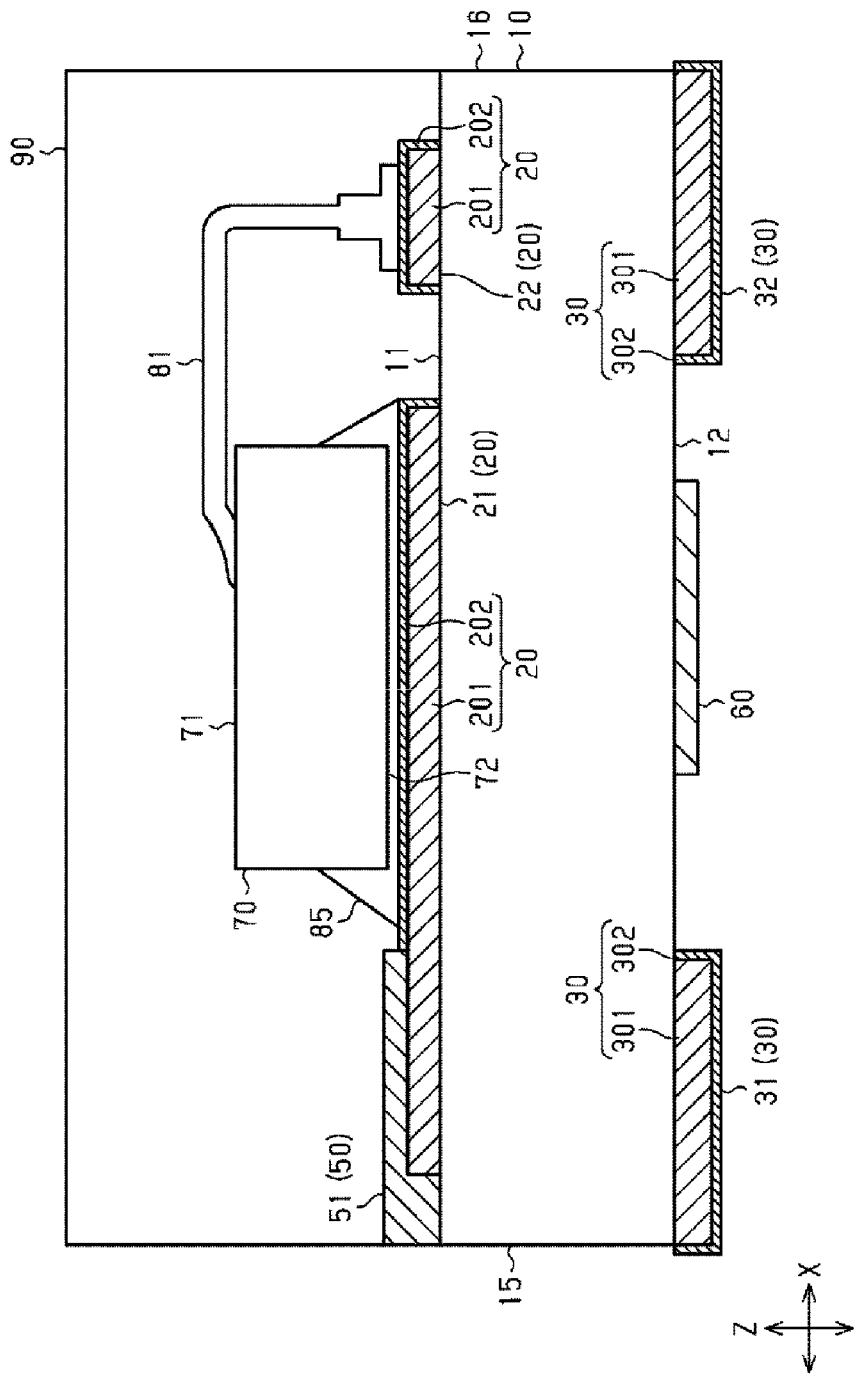
FIG. 9 is a cross-sectional view taken along a line 9-9 in FIG. 1.

As shown in FIG. 9, the semiconductor light emitting element 70 is mounted on the die pad 212 by a bonding member 85. The bonding member 85 is made of a synthetic resin (so-called Ag paste) using, for example, an epoxy resin containing silver (Ag) and has conductivity. The electrode pad on the back surface 72 of the semiconductor light emitting element 70 is electrically connected to the die pad 212 via the bonding member 85. One end of the wire 81 is connected to the electrode pad 711 on the main surface 71 of the semiconductor light emitting element 70, and the other end of the wire 81 is connected to the wire pad 222.

As shown in FIG. 1, the sealing resin 90 covers the main surface 11 of the substrate 10, the semiconductor light emitting element 70, the main surface electrode 20, the main surface insulating film 50, and the wire 81. The sealing resin 90 has a rectangular shape having a long side in the first direction X as viewed from the thickness direction Z. The sealing resin 90 includes a main surface 91 facing the thickness direction Z, a first side surface 95 and a second side surface 96 facing opposite sides in the first direction X, and a bottom surface 93 and a top surface 94 facing opposite sides in the second direction Y. In the present embodiment, the main surface 91 of the sealing resin 90 faces the same direction as the main surface 11 of the substrate 10. The bottom surface 93 of the sealing resin 90 is flush with the bottom surface 13 of the substrate 10. The first side surface 95 of the sealing resin 90 is flush with the first side surface 15 of the substrate 10, and the second side surface 96 of the sealing resin 90 is flush with the second side surface 16 of the substrate 10. The top surface 94 of the sealing resin 90 is flush with the top surface 14 of the substrate 10.

The sealing resin 90 is made of a light-transmitting resin material. Examples of such a resin material may include transparent or translucent epoxy resin, silicone resin, acrylic resin, polyvinyl-based resin, and the like. The sealing resin 90 may include a diffusing material that diffuses light from the semiconductor light emitting element 70, and a fluorescent material that emits light having different wavelengths when excited by the light from the semiconductor light emitting element 70.

For example, the sealing resin 90 is formed by dicing the substrate 10. The substrate 10 is formed by dicing a mother substrate on which a plurality of main surface electrodes is formed. A frame is fixed to the main surface of the mother substrate, and the resin material is injected into the frame. After the resin material is cured, the substrate 10 and the sealing resin 90 are obtained by dicing the resin material together with the mother substrate.

As shown in FIG. 9, the main surface electrode 20 includes a first metal layer 201 that is in contact with the main surface 11 of the substrate 10, and a second metal layer 202 that partially covers the first metal layer 201. The constituent material of the first metal layer 201 is, for example, copper (Cu), and the constituent material of the second metal layer 202 is, for example, nickel (Ni) or palladium (Pd). The surface of the first metal layer 201 may be roughened, for example by etching. This roughening makes it easy to adhere the second metal layer 202, the first insulating film 51, and the second insulating film 52 to the surface of the first metal layer 201.

The back surface electrode 30 includes a first metal layer 301 that is in contact with the back surface 12 of the substrate 10, and a second metal layer 302 that covers the first metal layer 301. The constituent materials of the first metal layer 301 and the second metal layer 302 are the same as those of the first metal layer 201 and the second metal layer 202 of the main surface electrode 20.

Here, an outline of a process of manufacturing the semiconductor light emitting device A10 will be described. First, a base material capable of forming a plurality of substrates 10 is prepared. As the base material, a double-sided laminated substrate provided with a copper foil on both sides thereof can be used. The copper foil on both surfaces of the base material is patterned by etching or the like to form the first metal layer 201 of the main surface electrode 20 and the first metal layer 301 of the back surface electrode 30. A through hole is formed in the base material by, for example, a drill. This through hole becomes the first through groove 171 and the second through groove 172 described above. At this time, the through hole penetrates the copper foil to be the main surface electrode 20 and the back surface electrode 30. For example, the through electrode 40 is formed on an inner surface of the through hole by electrolytic plating. Then, the main surface insulating film 50 is formed to cover the main surface electrode 20, and the back surface insulating film 60 is formed between the back surface electrodes 30.

Next, the second metal layer 202 on the surface of the first metal layer 201 of the main surface electrode 20 and the second metal layer 302 on the surface of the first metal layer 301 of the back surface electrode 30 are formed by, for example, electrolytic plating. The second metal layer 202 is formed on the surface of the first metal layer 201 that is not covered with the main surface insulating film 50. Next, the semiconductor light emitting element 70 is mounted on each main surface electrode 20, and the wire 81 is connected. The sealing resin 90 is formed on the main surface of the base material.

Next, using a dicing blade or the like, the base material, the sealing resin, and the like are diced so as to divide the through holes. Thus, the diced semiconductor light emitting device A10 is obtained. The second metal layer 202 is formed on the exposed end surface of the diced semiconductor light emitting device A10 by, for example, barrel plating. Therefore, as shown in FIG. 9, in the main surface electrode 20, the second metal layer 202 protrudes from the first side surface 15 and the second side surface 16 of the substrate 10 and the first side surface 95 and the second side surface 96 of the sealing resin 90. Similarly, in the back surface electrode 30, the second metal layer 302 protrudes from the first side surface 15 and the second side surface 16 of the substrate 10. Although not shown, a second metal layer that protrudes from the top surface 14 of the substrate 10 is also formed on the connection portion 223 and the wire pad 222 of the main surface electrode 20 shown in FIG. 3.

(Operation)

As shown in FIGS. 10 and 11, the semiconductor light emitting device A10 is mounted on the circuit board P10. The circuit board P10 includes a land P12 for mounting on the top surface of the circuit board P10. The semiconductor light emitting device A10 is connected to the land P12 by a solder P20. At this time, as shown in FIGS. 3 and 4, the solder P20 shown in FIGS. 10 and 11 enters the first through electrode 41 and the second through electrode 42 disposed in the first through groove 171 and the second through groove 172 that are recessed in the substrate 10 of the semiconductor light emitting element 70, and the semiconductor light emitting device A10 is mounted on the land P12 of the circuit board P10 by the solder P20.

The semiconductor light emitting device A10 includes the main surface insulating film 50 that covers the main surface electrode 20 disposed on the main surface 11 of the substrate 10. As shown in FIGS. 1 and 3, the main surface insulating film 50 includes the first insulating film 51 and the second insulating film 52 that cover the first base portion 211 and the second base portion 221 in the first main surface electrode 21 and the second main surface electrode 22.

The first insulating film 51 includes a portion that covers the first main surface electrode 21 between the first base portion 211 and the die pad 212 and whose both ends are in contact with the main surface 11 of the substrate 10. Accordingly, the solder P20 (see FIGS. 10 and 11) attached to the first through electrode 41 connected to the first base portion 211 is unlikely to enter between the first base portion 211 and the first insulating film 51. Therefore, since the solder P20 is prevented from penetrating into the semiconductor light emitting device A10 from between the first main surface electrode 21 and the first insulating film 51, an occurrence of a defect due to the semiconductor light emitting element 70 separating from the die pad 212 is suppressed.

The second insulating film 52 includes a portion that covers the second main surface electrode 22 between the second base portion 221 and the wire pad 222 and whose both ends are in contact with the main surface 11 of the substrate 10. Therefore, similar to the first insulating film 51, since the solder P20 is prevented from penetrating into the semiconductor light emitting device A10 from between the second main surface electrode 22 and the second insulating film 52, an occurrence of a defect due to the wire 81 separating from the wire pad 222 is suppressed.

Further, the semiconductor light emitting device A10 includes the back surface electrode 30 on the back surface 12 of the substrate 10. As shown in FIG. 11, since the solder P20 forms a fillet P21 on the back surface electrode 30, the mounting of the semiconductor light emitting device A10 on the circuit board P10 can be confirmed by the fillet P21. Furthermore, the mounting strength with respect to the circuit board P10 can be further increased by the fillet P21.

The sealing resin 90 covers the main surface 11 of the substrate 10, the main surface electrode 20, the main surface insulating film 50, the semiconductor light emitting element 70, and the wire 81. The sealing resin 90 has good adhesion to the main surface insulating film 50. Accordingly, the sealing resin 90 is prevented from being peeled off as compared with a case where the main surface insulating film 50 is not provided.

As described above, according to the present embodiment, the following effects can be obtained.

(1) The semiconductor light emitting device A10 includes the main surface insulating film 50 that covers the main surface electrode 20 disposed on the main surface 11 of the substrate 10. The main surface insulating film 50 includes the first insulating film 51 and the second insulating film 52 that cover the first base portion 211 and the second base portion 221 in the first main surface electrode 21 and the second main surface electrode 22. The first insulating film 51 has a portion that covers the first main surface electrode 21 between the first base portion 211 and the die pad 212 and whose both ends are in contact with the main surface 11 of the substrate 10. Accordingly, the solder P20 attached to the first through electrode 41 connected to the first base portion 211 is unlikely to enter between the first base portion 211 and the first insulating film 51. Therefore, since the solder P20 is prevented from penetrating into the semiconductor light emitting device A10 from between the first main surface electrode 21 and the first insulating film 51, an occurrence of a defect due to the semiconductor light emitting element 70 separating from the die pad 212 is suppressed.

(2) The second insulating film 52 has a portion that covers the second main surface electrode 22 between the second base portion 221 and the wire pad 222 and whose both ends are in contact with the main surface 11 of the substrate 10. Therefore, similar to the first insulating film 51, since the solder P20 is prevented from penetrating into the semiconductor light emitting device A10 from between the second main surface electrode 22 and the second insulating film 52, an occurrence of a defect due to the wire 81 separating from the wire pad 222 is suppressed.

(3) The sealing resin 90 covers the main surface 11 of substrate 10, the main surface electrode 20, the main surface insulating film 50, the semiconductor light emitting element 70, and the wire 81. The sealing resin 90 has good adhesion to the main surface insulating film 50. Therefore, the sealing resin 90 is prevented from being peeled off as compared with a case where the main surface insulating film 50 is not provided.

(Modification of First Embodiment)

Figure 12:
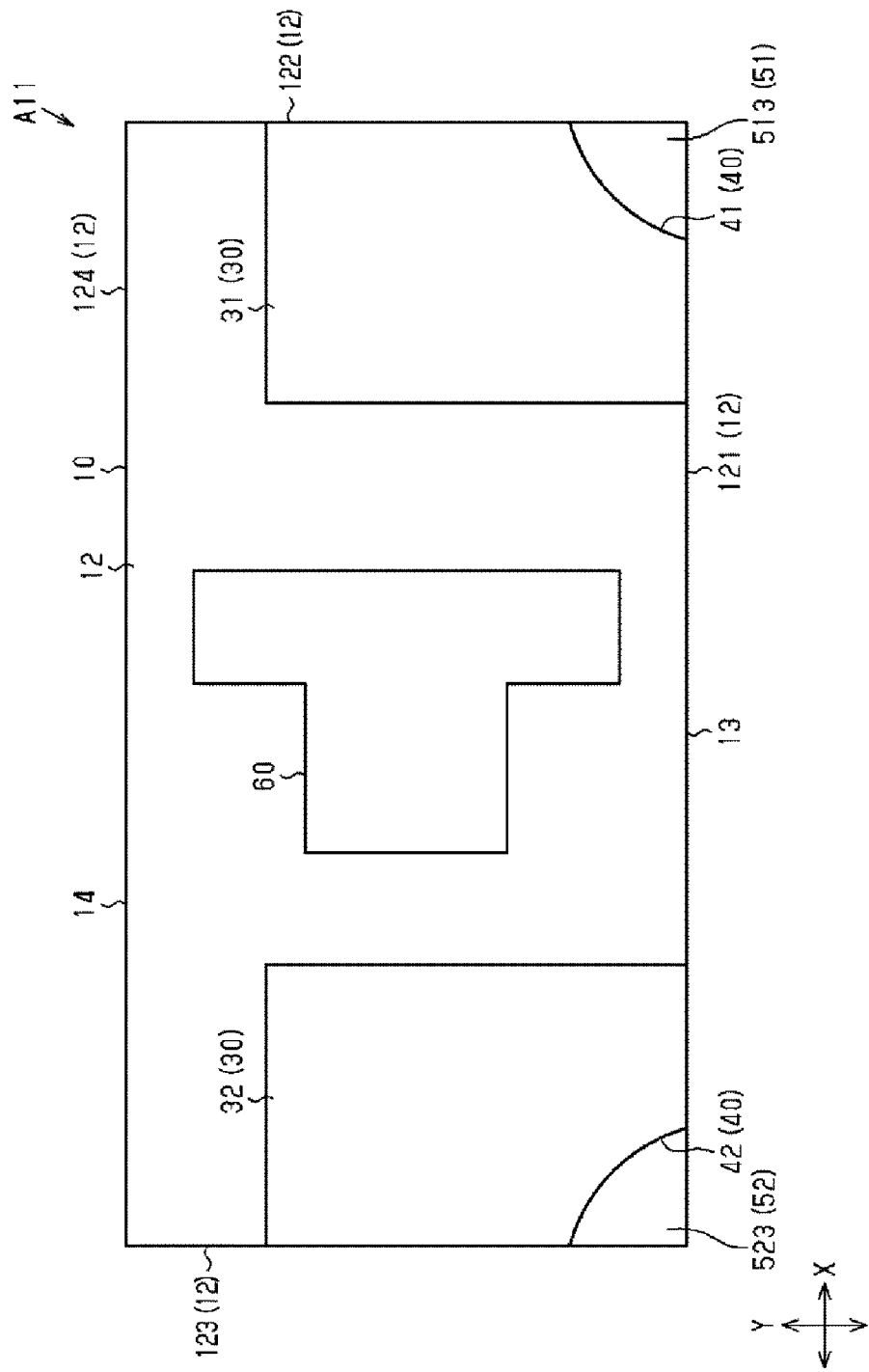
FIG. 12 is a rear view showing a modification of the semiconductor light emitting device according to the first embodiment.
Figure 13:
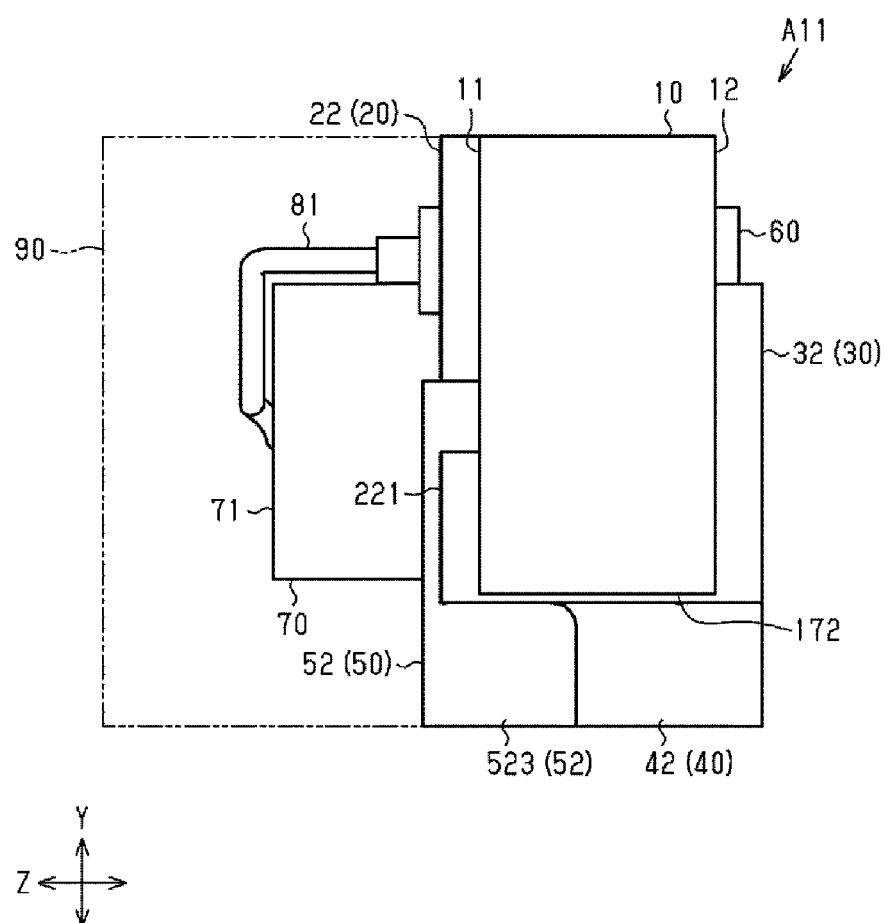
FIG. 13 is a right side view of the semiconductor light emitting device according to the modification in FIG. 12.

As shown in FIGS. 12 and 13, in a semiconductor light emitting device A11, a height of the first back surface electrode 31 and the second back surface electrode 32 constituting the back surface electrode 30 in the second direction Y is about ¾ of a height of the substrate 10 in the second direction Y. Such semiconductor light emitting device A11 can also be mounted with sufficient strength on the circuit board P10 shown in FIGS. 10 and 11.

Figure 14:
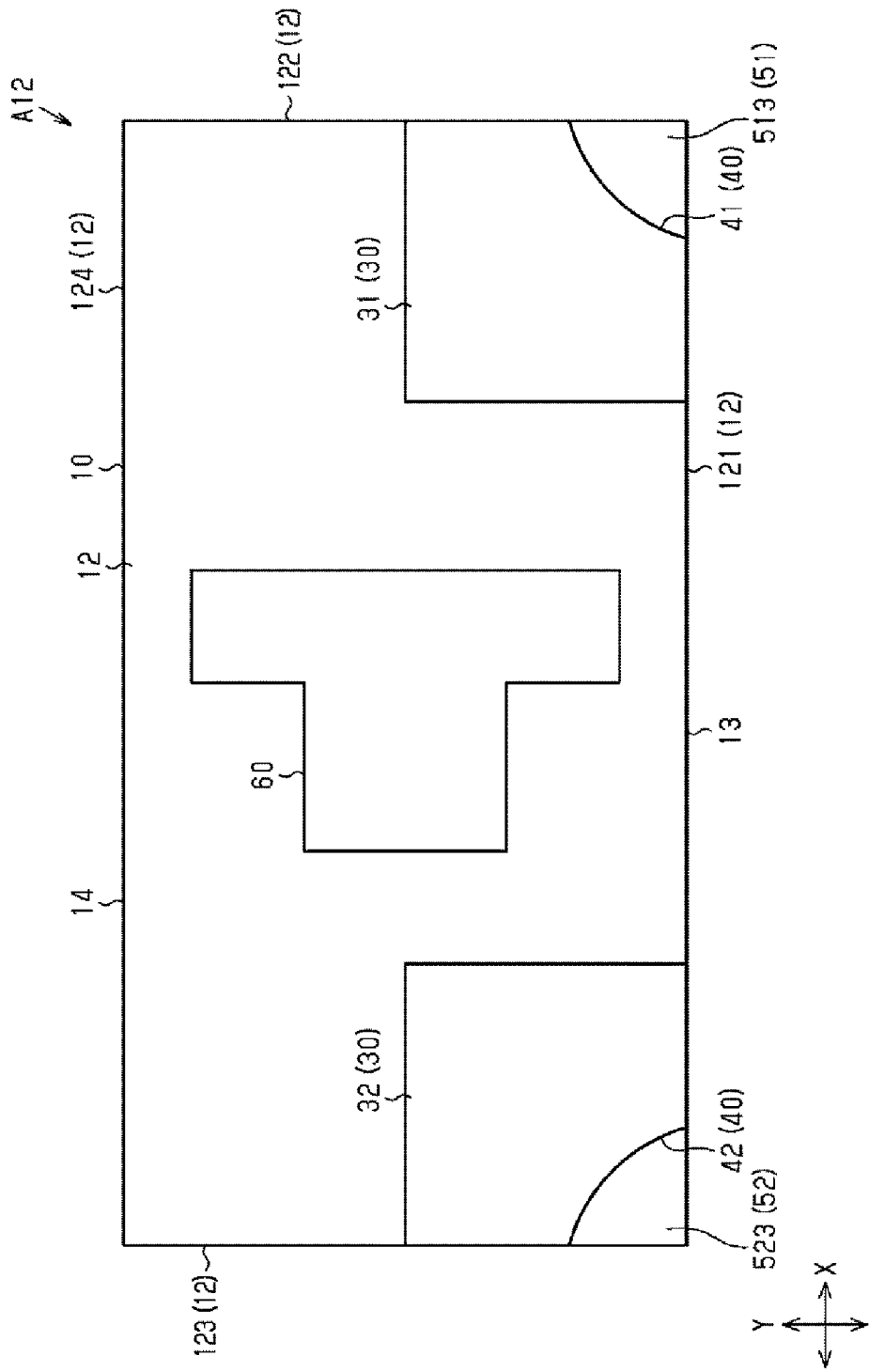
FIG. 14 is a rear view showing a modification of the semiconductor light emitting device according to the first embodiment.
Figure 15:
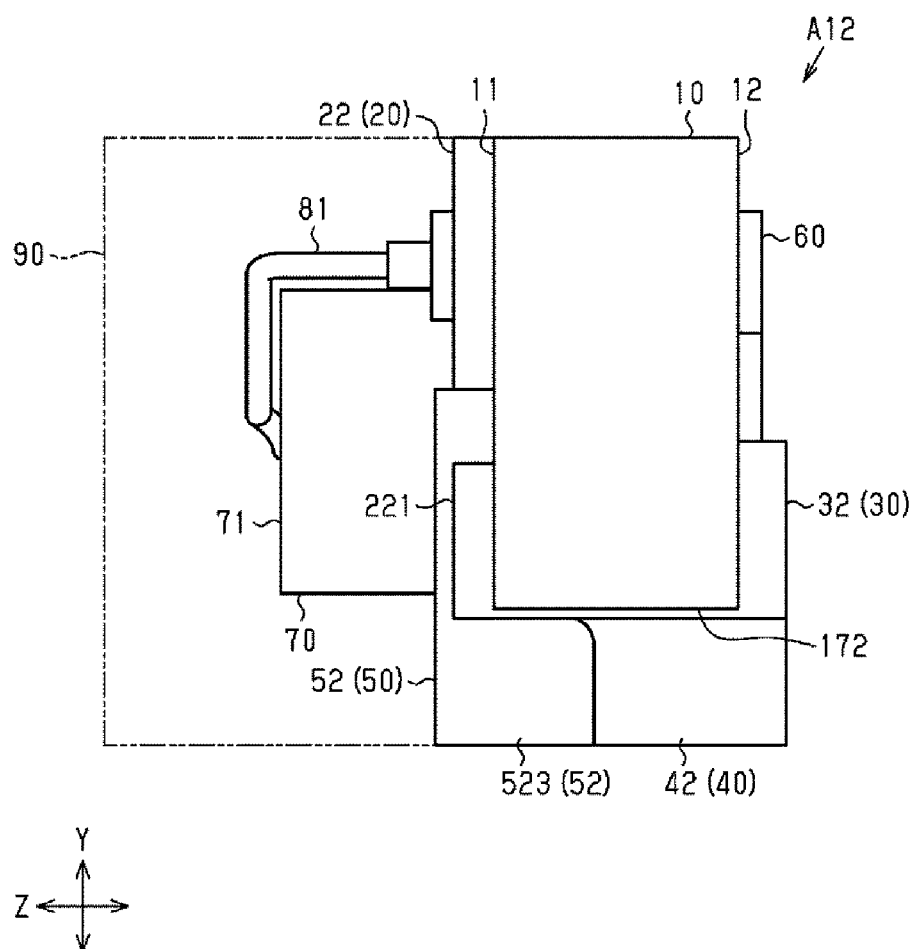
FIG. 15 is a right side view of the semiconductor light emitting device according to the modification in FIG. 14.

As shown in FIGS. 14 and 15, in a semiconductor light emitting device A12, a height of the first back surface electrode 31 and the second back surface electrode 32 in the second direction Y is about ½ of the height of the substrate 10 in the second direction Y. Such semiconductor light emitting device A12 can also be mounted with sufficient strength on the circuit board P10 shown in FIGS. 10 and 11.

As shown in FIGS. 12 to 15, when the height of the first back surface electrode 31 and the second back surface electrode 32 are reduced, an amount of solder P20 (see FIGS. 10 and 11) adhering thereto is decreased and the fillet P21 can be reduced. Even in such a small fillet P21, the mounting of the semiconductor light emitting devices A11 and A12 on the circuit board P10 can be confirmed. Further, by reducing the fillet P21, the semiconductor light emitting devices A11 and A12 can be mounted with the land P12 (see FIG. 11) having a smaller area.

Second Embodiment

Hereinafter, a semiconductor light emitting device according to a second embodiment of the present disclosure will be described with reference to FIGS. 16 to 24. In this embodiment, the same constituent members as the aforementioned embodiment are denoted by the same reference numerals or symbols, and explanation thereof will not be repeated.

Figure 16:
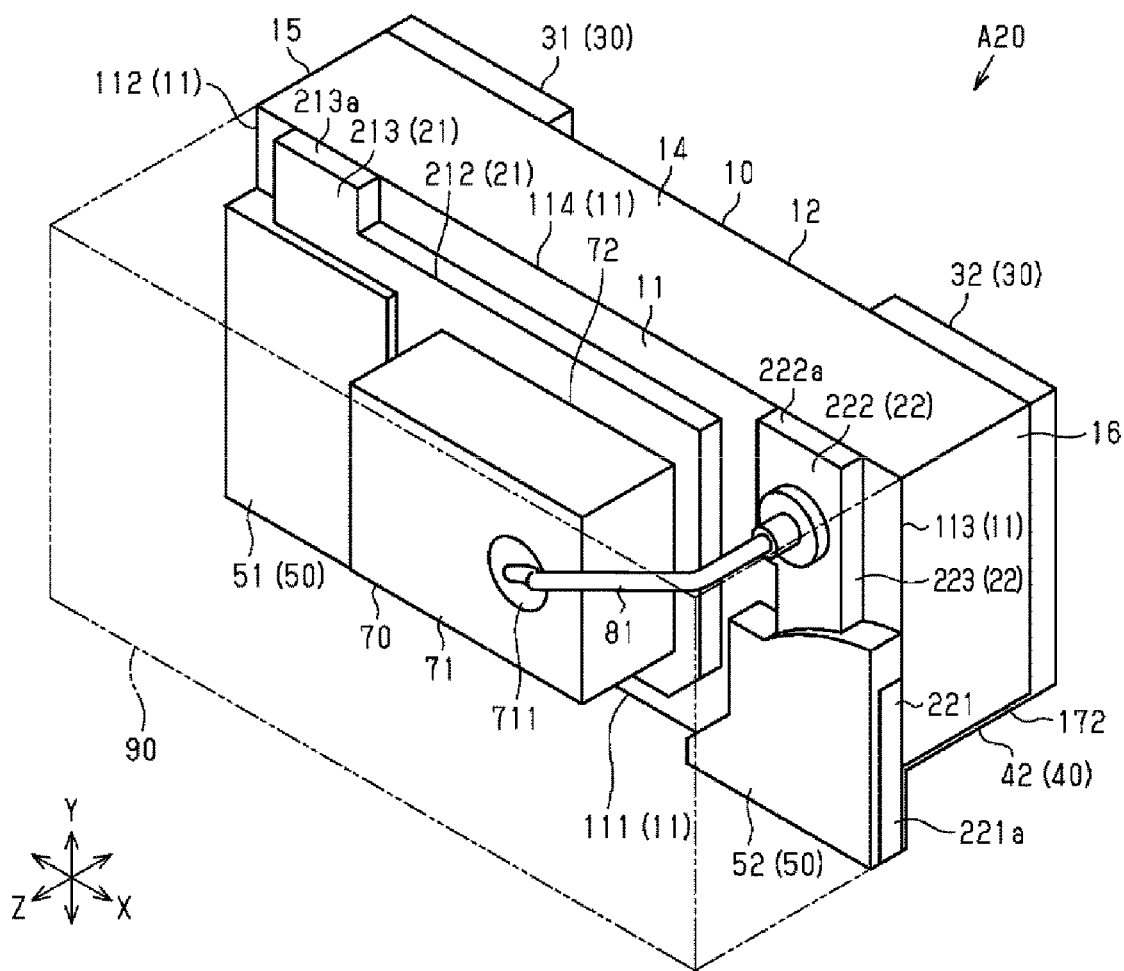
FIG. 16 is a perspective view of a semiconductor light emitting device, when viewed from the front upper right side, according to a second embodiment of the present disclosure.
Figure 17:
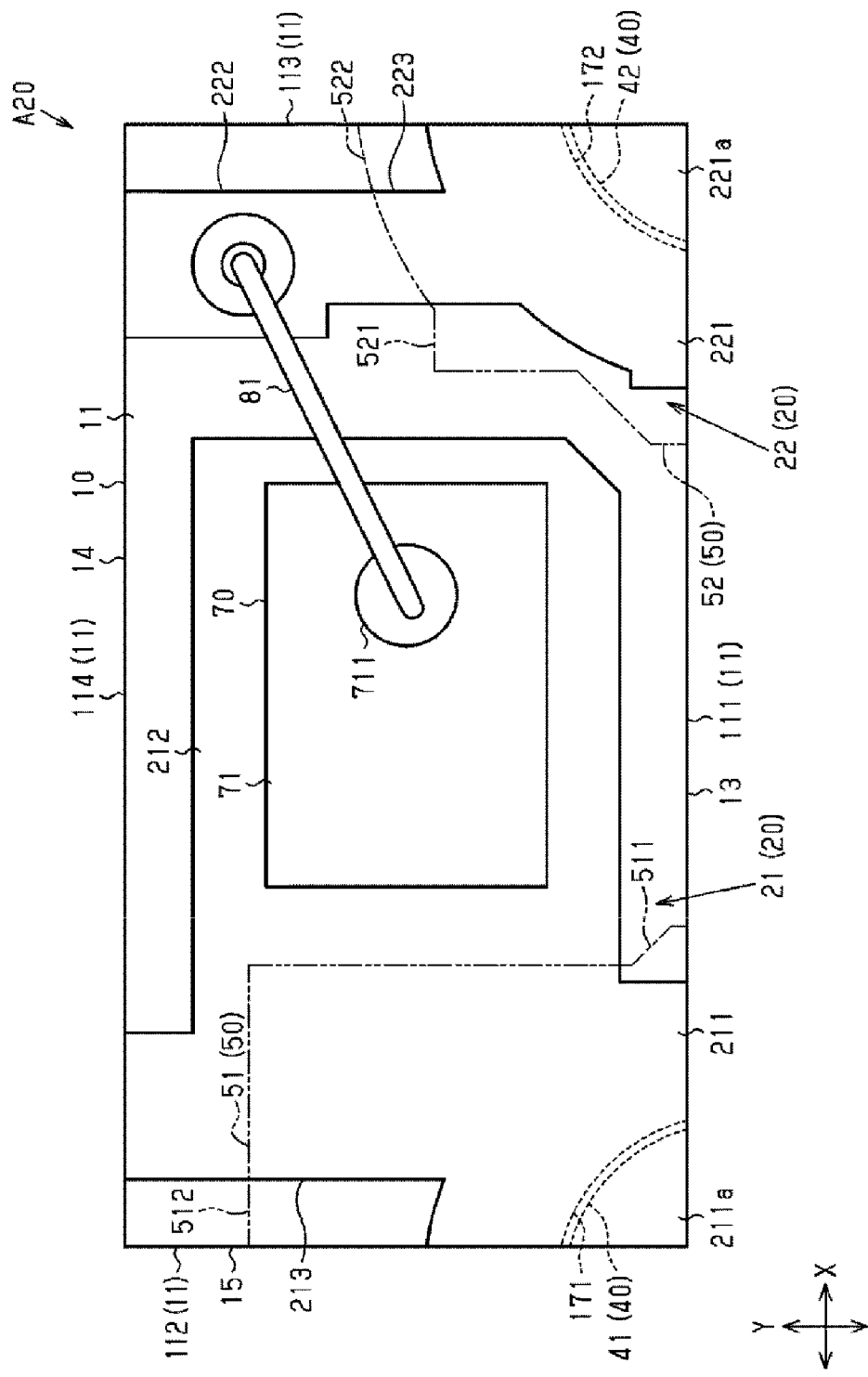
FIG. 17 is a front view of the semiconductor light emitting device according to the second embodiment.
Figure 18:
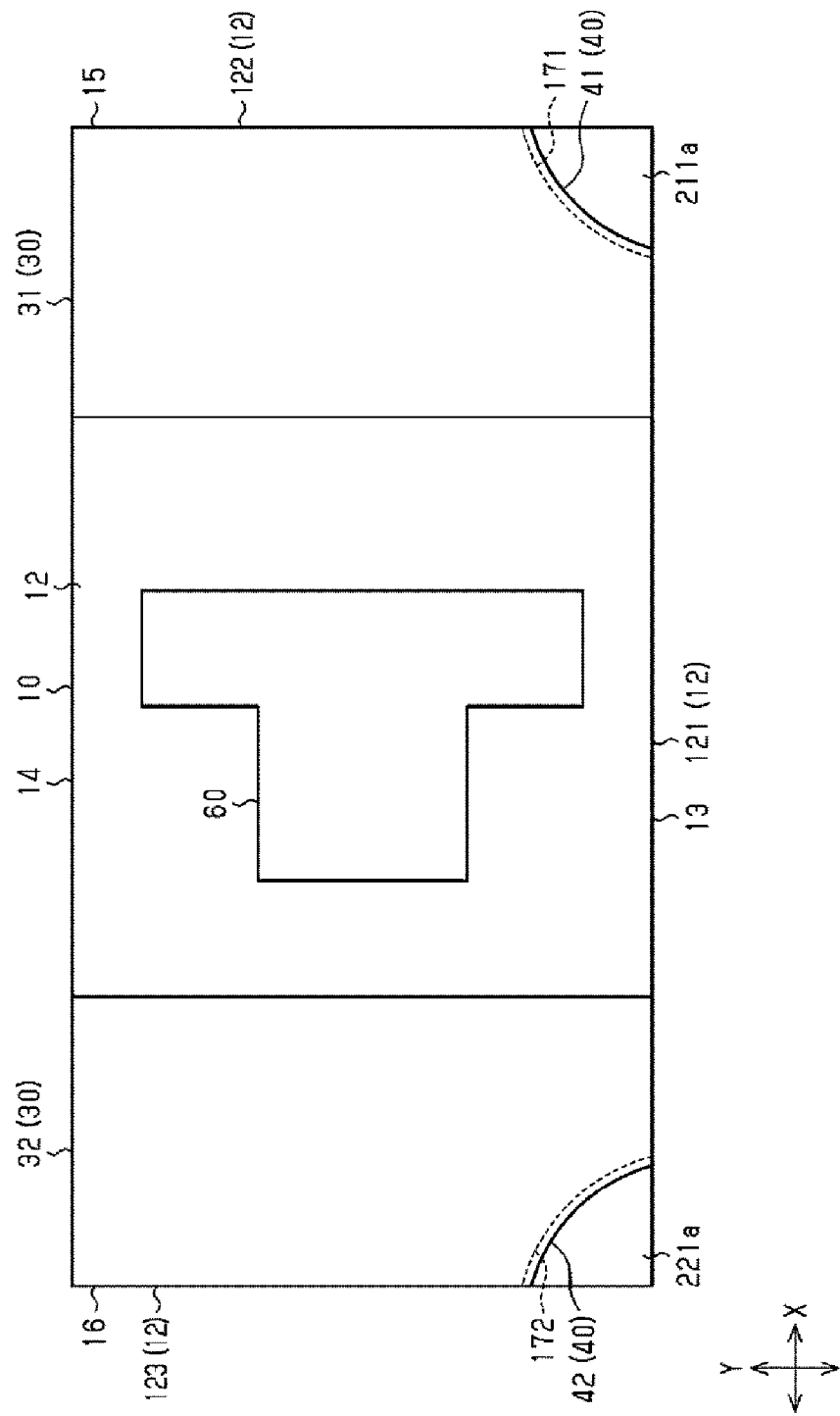
FIG. 18 is a rear view of the semiconductor light emitting device according to the second embodiment.
Figure 19:
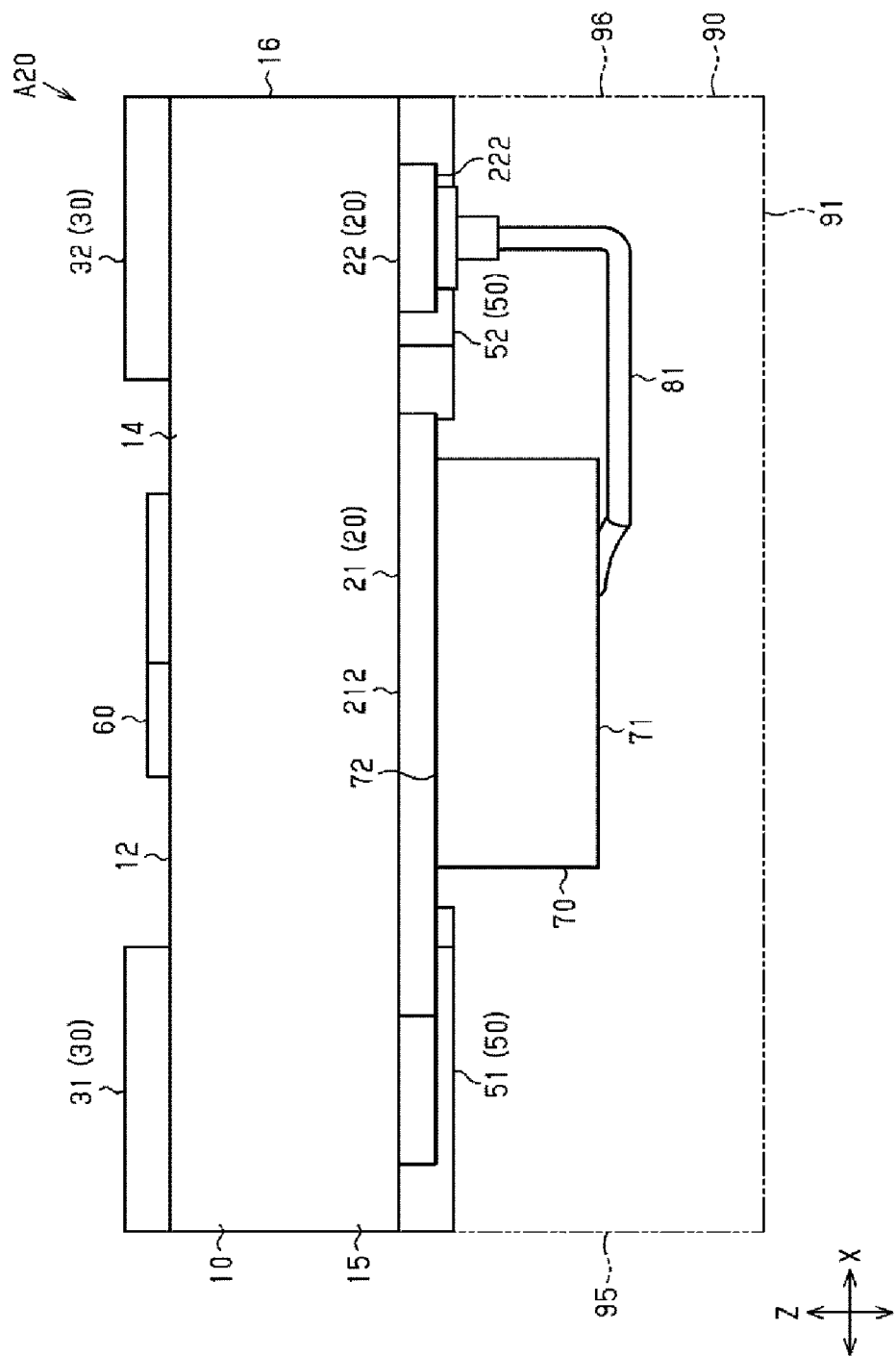
FIG. 19 is a top view of the semiconductor light emitting device according to the second embodiment.
Figure 20:
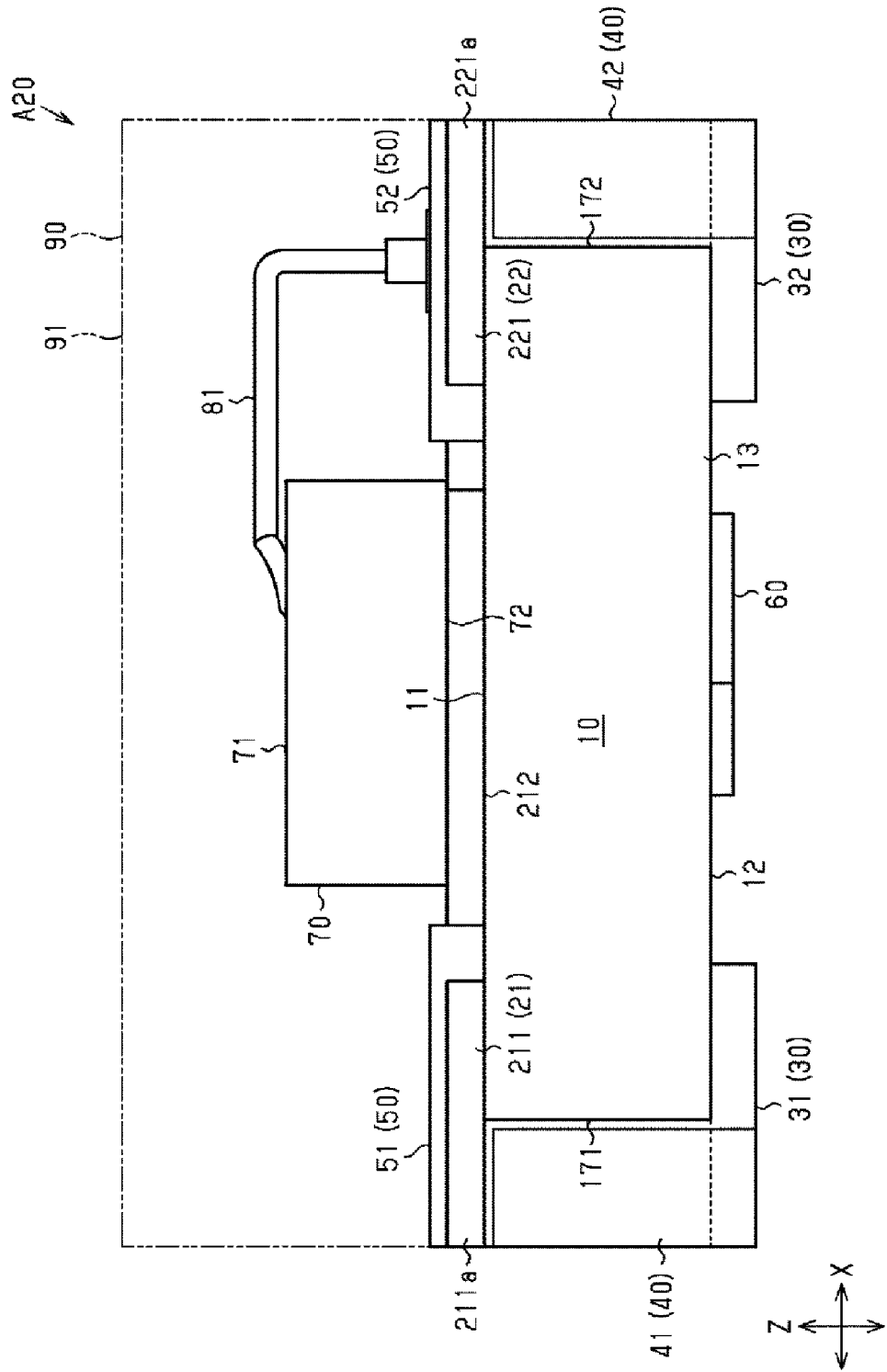
FIG. 20 is a bottom view of the semiconductor light emitting device according to the second embodiment.
Figure 21:
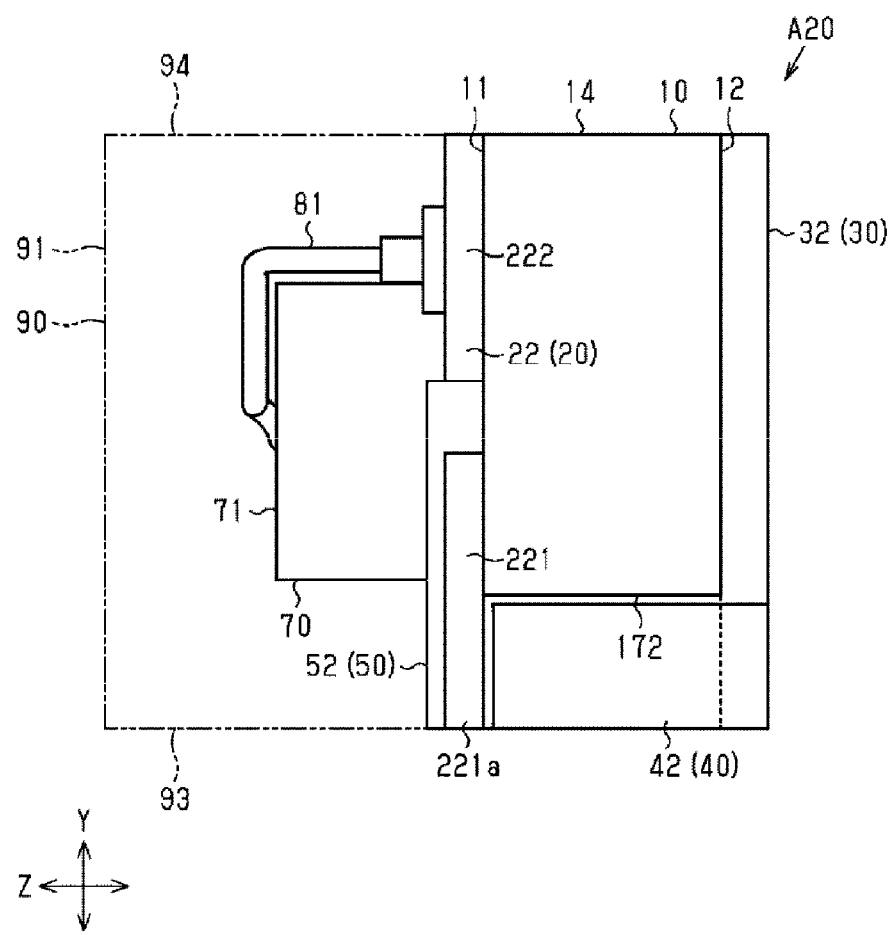
FIG. 21 is a right side view of the semiconductor light emitting device according to the second embodiment.
Figure 22:
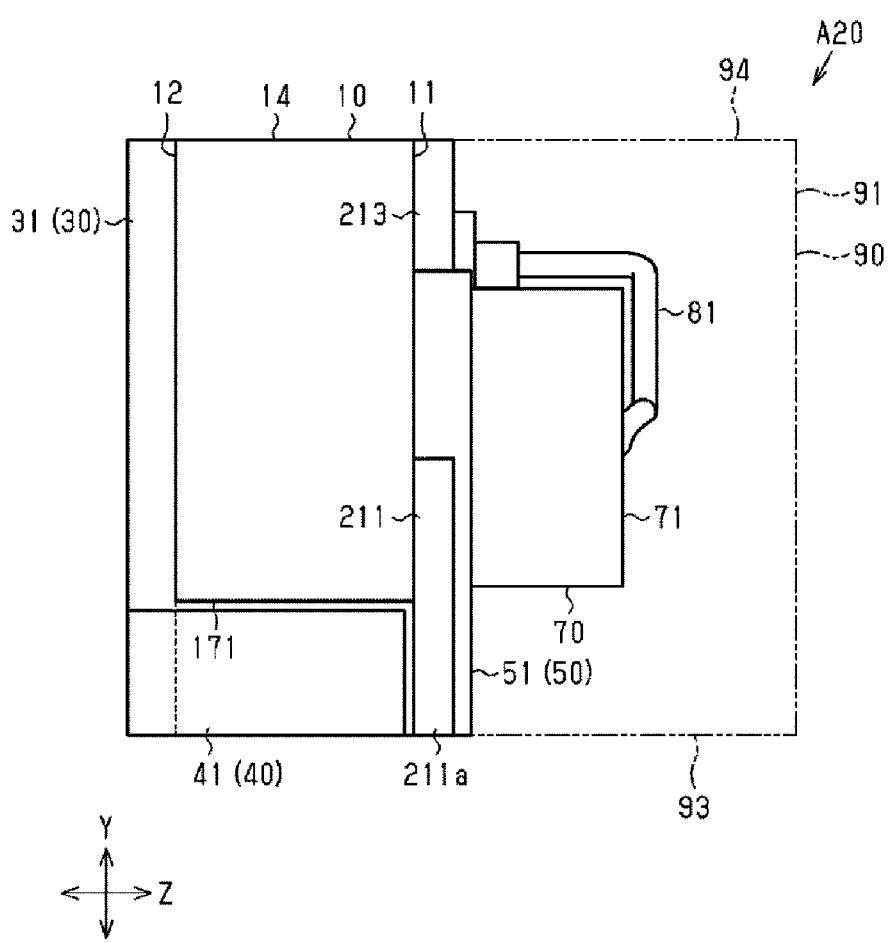
FIG. 22 is a left side view of the semiconductor light emitting device according to the second embodiment.

In FIGS. 16 and 19, a sealing resin is indicated by a two-dot chain line for convenience of understanding. In FIG. 17, for convenience of understanding, the sealing resin is omitted, and a main surface insulating film is indicated by a two-dot chain line.

A semiconductor light emitting device A20 according to this embodiment is different from that of the first embodiment in terms of the shapes of the main surface electrode 20 and the main surface insulating film 50. As shown in FIG. 17, the main surface electrode 20 includes a first main surface electrode 21 and a second main surface electrode 22.

The first main surface electrode 21 includes a first base portion 211, a die pad 212, and a connection portion 213. The first base portion 211 of this embodiment includes a fan shape with a central angle of 90 degrees (quarter circular shape). That is, the first base portion 211 of this embodiment has a corner portion 211a that protrudes into the first through groove 171.

The second main surface electrode 22 includes a second base portion 221, a wire pad 222, and a connection portion 223. The second base portion 221 of this embodiment has a fan shape with a central angle of 90 degrees (quarter circular shape). That is, the second base portion 221 of this present embodiment includes a corner portion 221a that protrudes into the second through groove 172.

The main surface insulating film 50 includes a first insulating film 51 and a second insulating film 52. The first insulating film 51 covers the surface of the first base portion 211 and the surface of the connection portion 213. Further, the first insulating film 51 is in contact with the main surface 11 so as to be in contact with the first side 111 and the second side 112 on the main surface 11 of the substrate 10. Then, the first insulating film 51 of this embodiment covers the corner portion 211a of the first base portion 211 and does not enter the first through groove 171. Therefore, in this embodiment, the entire inner surface of the first through electrode 41 is exposed.

The second insulating film 52 covers the surface of the second base portion 221 and the surface of the connection portion 223. Further, the second insulating film 52 is in contact with the main surface 11 so as to be in contact with the first side 111 and the third side 113 on the main surface 11 of the substrate 10. Then, the second insulating film 52 of this embodiment covers the corner portion 221a of the second base portion 221 and does not enter the second through groove 172. Therefore, in this embodiment, the entire inner surface of the second through electrode 42 is exposed.

Figure 23:
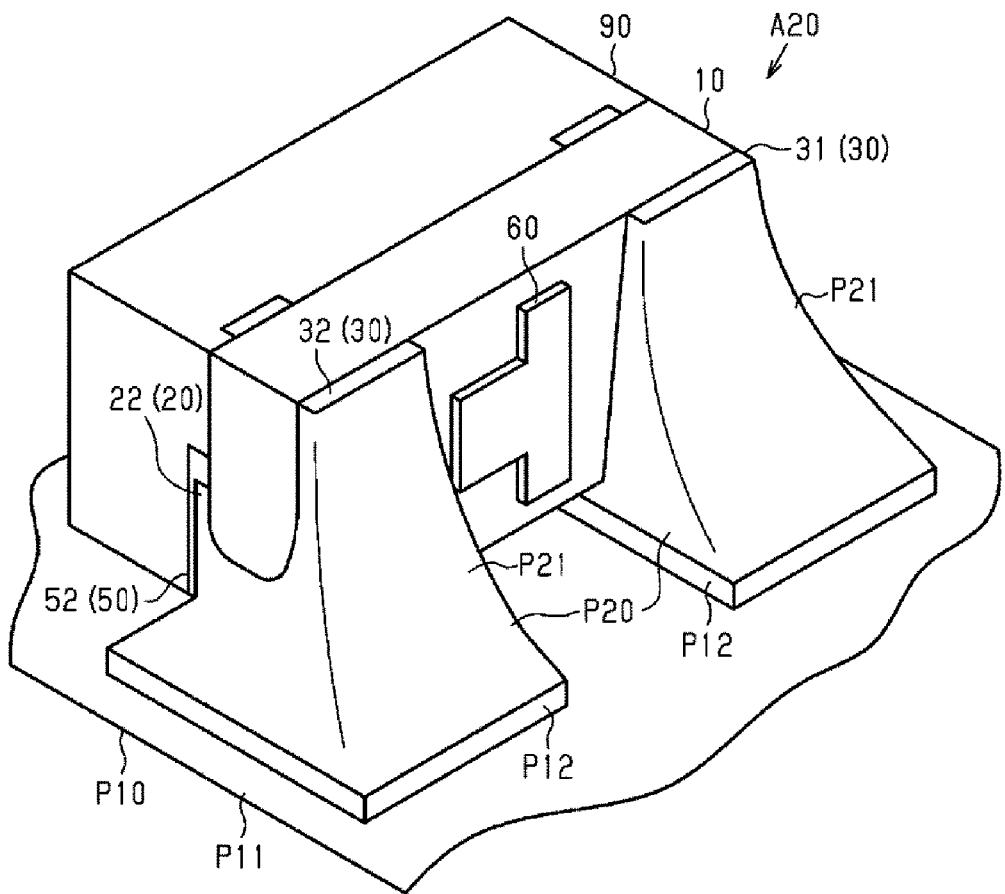
FIG. 23 is a perspective view showing a mounted state of the semiconductor light emitting device according to the second embodiment.
Figure 24:
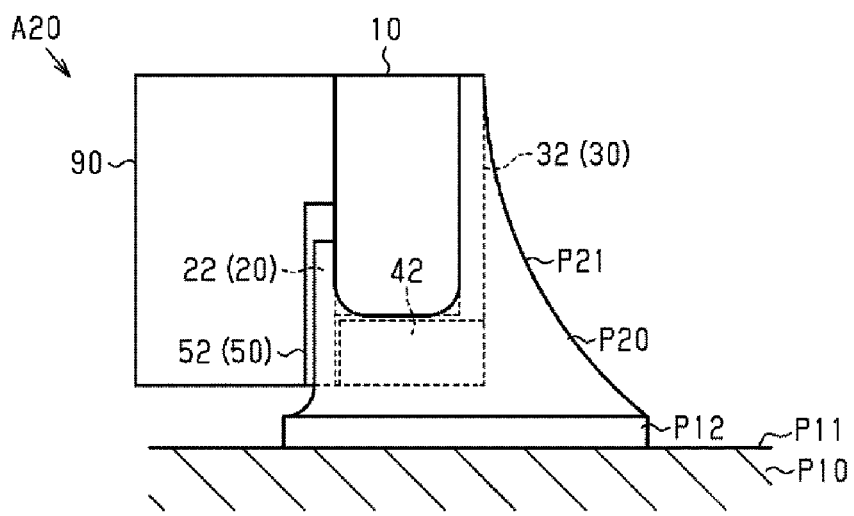
FIG. 24 is a right side view showing a mounting state of the semiconductor light emitting device according to the second embodiment.

FIGS. 23 and 24 show a mounting state of the semiconductor light emitting device A20 according to the present embodiment. In the semiconductor light emitting device A20, the solder P20 is adhered to the entire wall surface of the second through electrode 42 penetrating the substrate 10 in the thickness direction Z of the substrate 10 on the second side surface 16 of the substrate 10. Then, the solder P20 is adhered to the second base portion 221 of the second main surface electrode 22 connected to the second through electrode 42, and the second back surface electrode 32 connected to the second through electrode 42. Although not shown, the same applies to the first side surface 15 side of the substrate 10. Therefore, the adhesion amount of the solder P20 on the side of the main surface 11 of the substrate 10 is increased, and the semiconductor light emitting device A20 can be stably fixed. Then, without using a jig or the like for fixing the semiconductor light emitting device A20, the semiconductor light emitting device A20 can be mounted on the circuit board P10 so that the optical axis is parallel to the circuit board P10.

Even in the semiconductor light emitting device A20 according to this embodiment, it is possible to suppress an occurrence of defects due to penetration of solder, as in the aforementioned embodiment.

Third Embodiment

Figure 25:
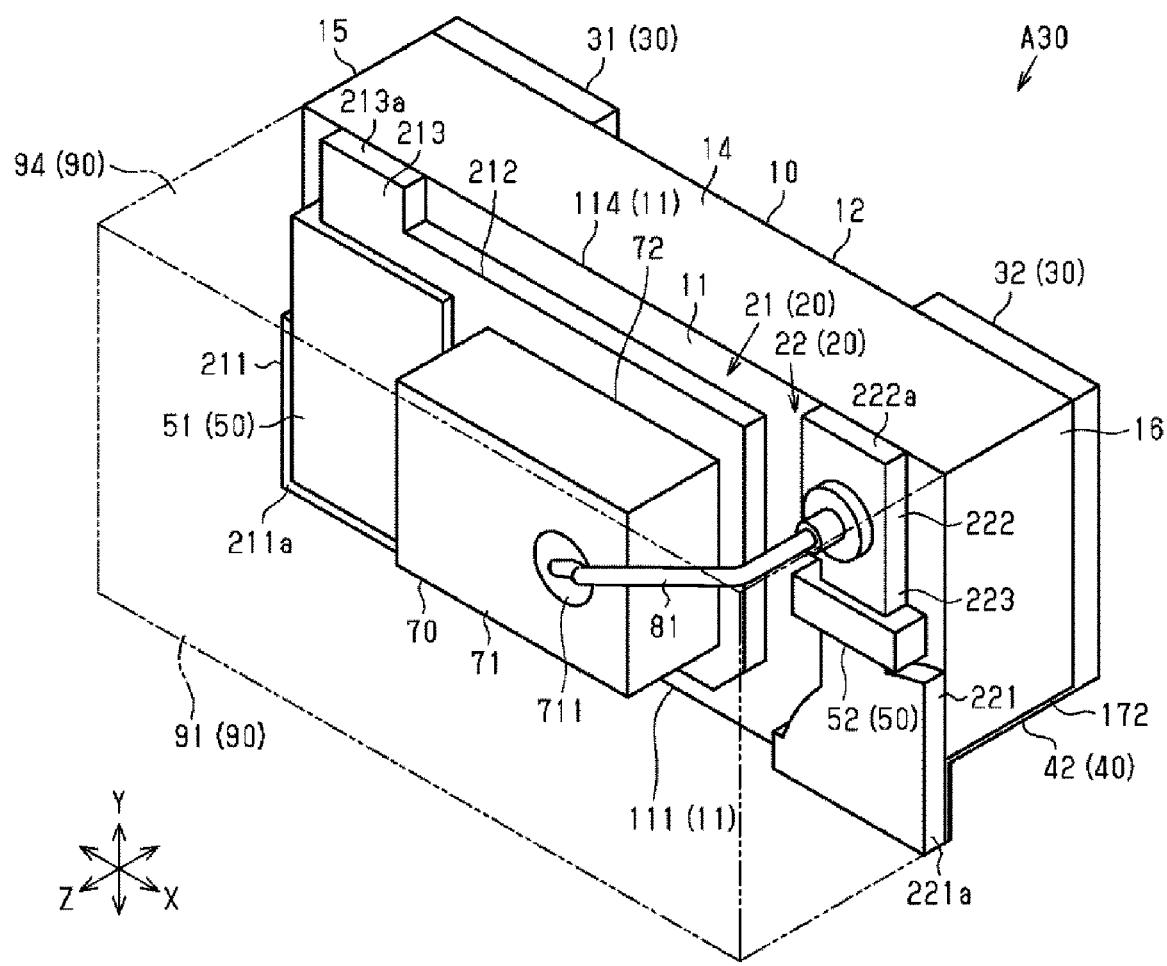
FIG. 25 is a perspective view of a semiconductor light emitting device, when viewed from the front upper right side, according to a third embodiment of the present disclosure.
Figure 26:
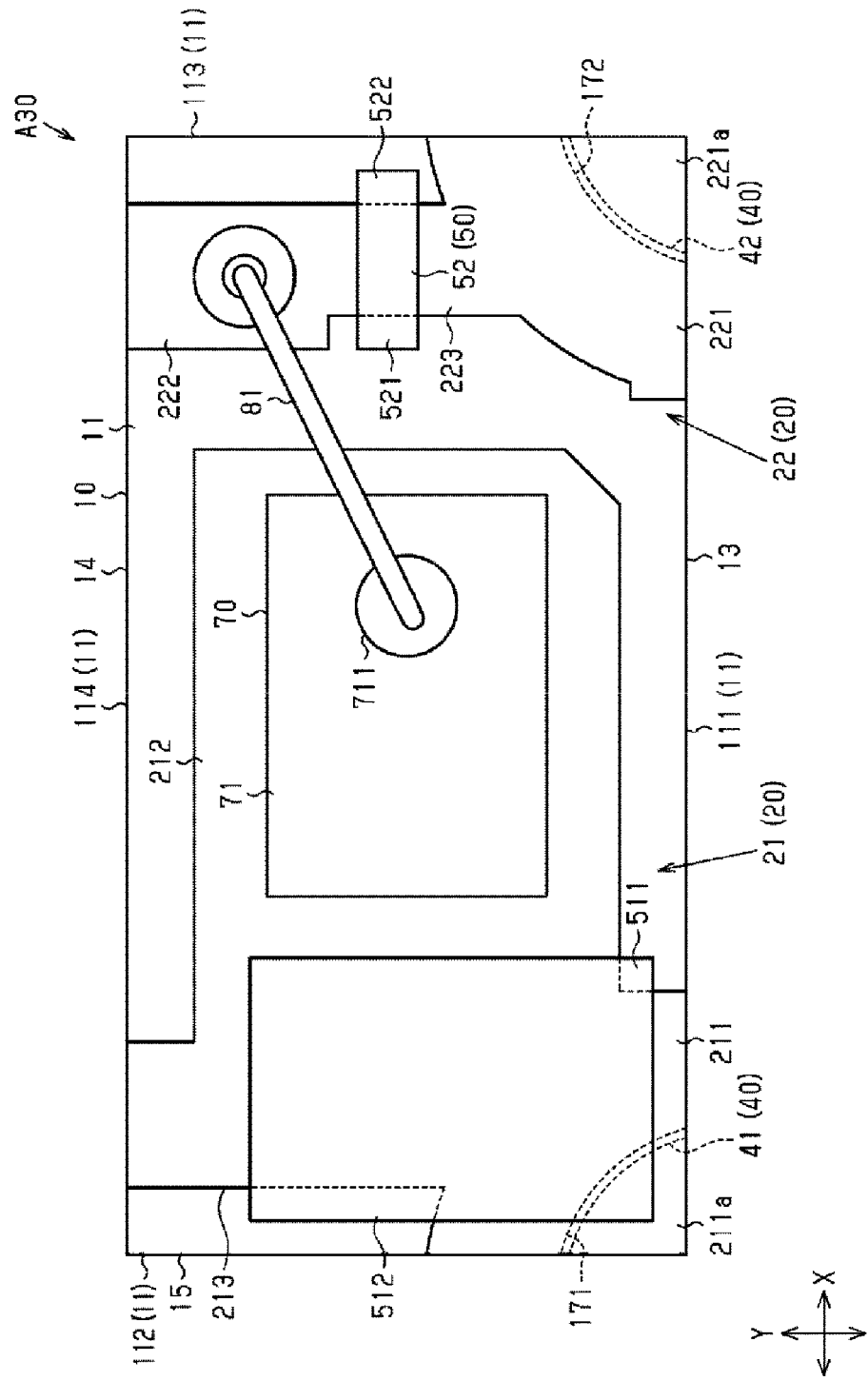
FIG. 26 is a front view of the semiconductor light emitting device according to the third embodiment.

Hereinafter, a semiconductor light emitting device according to a third embodiment of the present disclosure will be described with reference to FIGS. 25 and 26.

In this embodiment, the same constituent members as the aforementioned embodiments are denoted by the same reference numerals or symbols, and explanation thereof will not be repeated. In FIG. 25, a sealing resin is indicated by a two-dot chain line for convenience of understanding. In FIG. 26, the sealing resin is omitted for convenience of understanding.

A semiconductor light emitting device A30 according to this embodiment is different from that of the second embodiment in terms of the shape of the main surface insulating film 50. As shown in FIGS. 25 and 26, the main surface insulating film 50 includes a first insulating film 51 and a second insulating film 52.

The first insulating film 51 covers the surface of the first base portion 211 and the surface of the connection portion 213. Further, the first insulating film 51 is not in contact with the first side 111 and the second side 112 on the main surface 11 of the substrate 10, but is in contact with the main surface 11. The second insulating film 52 covers the surface of only the connection part 223. In addition, the second insulating film 52 is not in contact with the first side 111 and the third side 113 on the main surface 11 of the substrate 10, but is in contact with the main surface 11.

In this embodiment, it is possible to reduce the amount of resin used to form the main surface insulating film 50 while suppressing the occurrence of defects.

Fourth Embodiment

Hereinafter, a semiconductor light emitting device according to a fourth embodiment of the present disclosure will be described with reference to FIGS. 27 to 29.

In this embodiment, the same constituent members as the aforementioned embodiments are denoted by the same reference numerals or symbols, and explanation thereof will not be repeated. In FIG. 27, a sealing resin is indicated by a two-dot chain line for convenience of understanding. In FIG. 28, for convenience of understanding, the sealing resin is omitted, and a main surface insulating film is indicated by a two-dot chain line.

Figure 27:
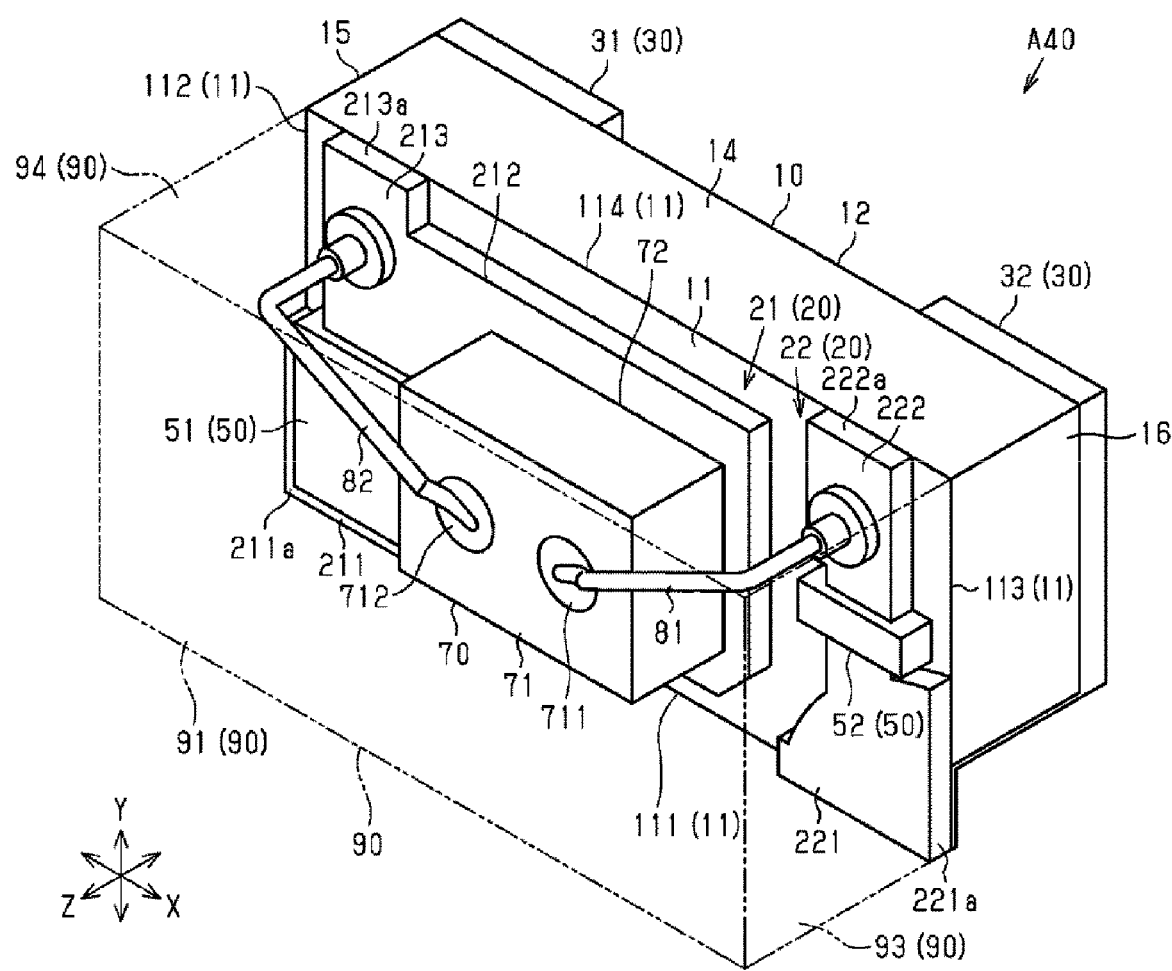
FIG. 27 is a perspective view of a semiconductor light emitting device, when viewed from the front upper right side, according to a fourth embodiment of the present disclosure.
Figure 28:
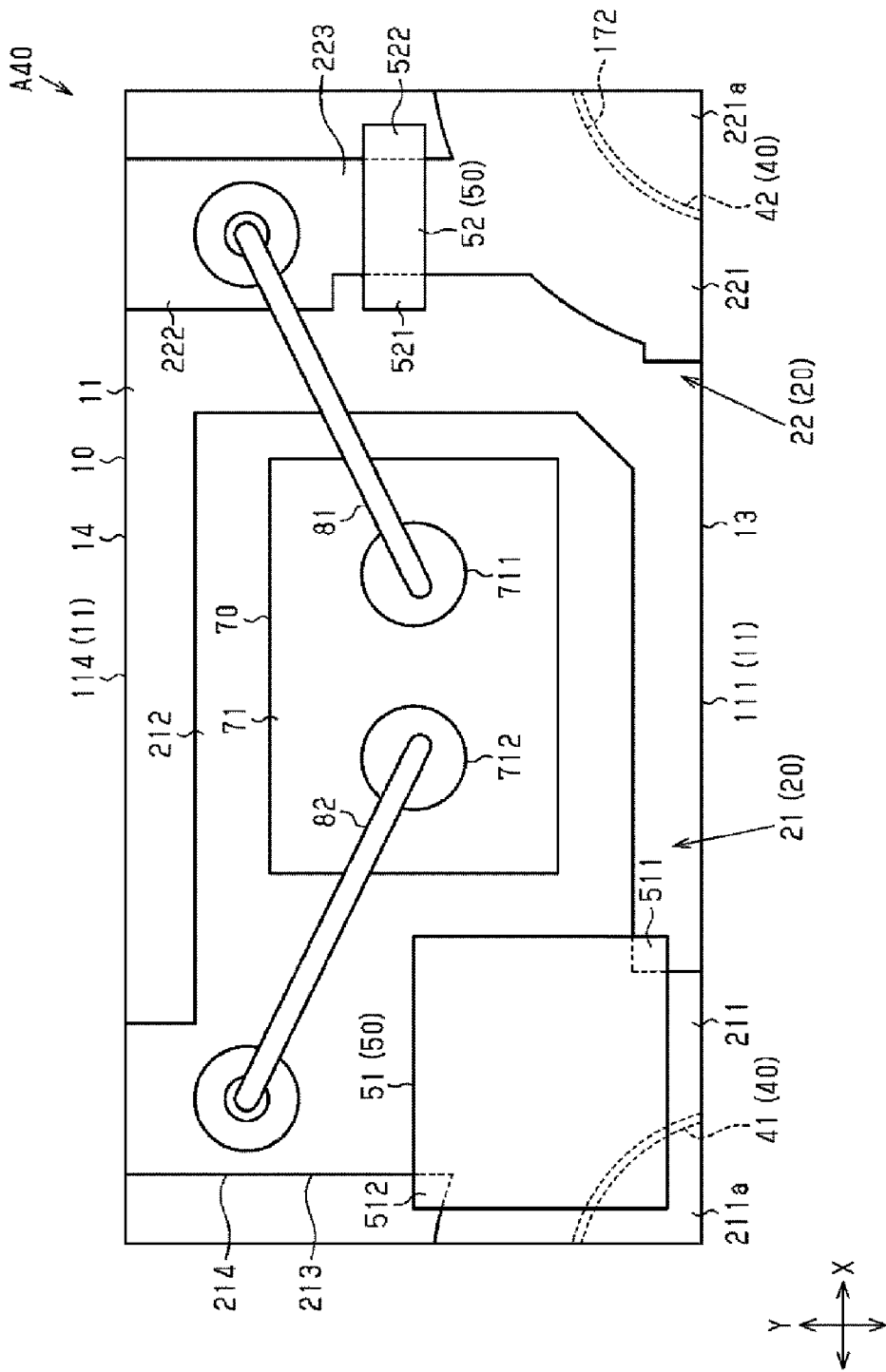
FIG. 28 is a front view of the semiconductor light emitting device according to the fourth embodiment.

As shown in FIGS. 27 and 28, a semiconductor light emitting device A40 according to this embodiment is different from the third embodiment in terms of the semiconductor light emitting element 70, the main surface electrode 20, the main surface insulating film 50, and the wires 81 and 82.

The main surface electrode 20 includes a first main surface electrode 21 and a second main surface electrode 22. The first main surface electrode 21 of this embodiment includes a first base portion 211, a die pad 212, a wire pad 214, and a connection portion 213. The wire pad 214 is formed on the side of the top surface 14 of the substrate 10 with respect to the connection portion 213. In this embodiment, the wire pad 222 is in contact with the fourth side 114 of the main surface 11.

The semiconductor light emitting element 70 of this embodiment includes two electrode pads 711 and 712 on the main surface. One end of the wire 82 is connected to the electrode pad 712, and the other end of the wire 82 is connected to the wire pad 214 of the first main surface electrode 21. One end of the wire 81 is connected to the electrode pad 711, and the other end of the wire 81 is connected to the wire pad 222 of the second main surface electrode 22.

Figure 29:
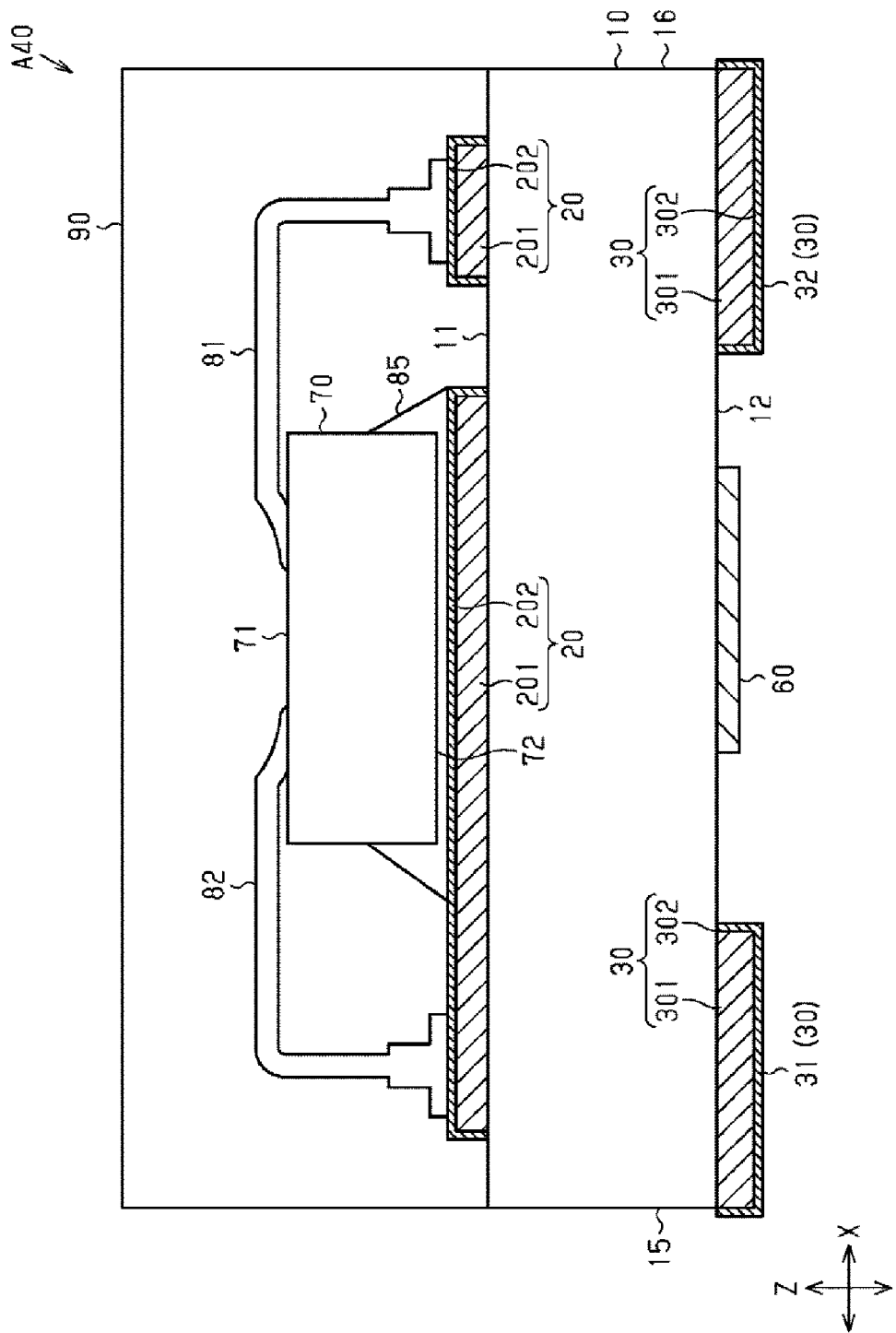
FIG. 29 is a cross-sectional view of the semiconductor light emitting device according to the fourth embodiment.

As shown in FIG. 29, the semiconductor light emitting element 70 is mounted on the die pad 212 by a bonding member 85. In this embodiment, a material mainly selected for heat dissipation may also be used as the bonding member 85.

The main surface insulating film 50 includes a first insulating film 51 and a second insulating film 52. The first insulating film 51 of this embodiment covers an area between the die pad 212 and the first base portion 211, and both end portions 511 and 512 thereof are in contact with the main surface 11 of the substrate 10 across the first main surface electrode 21.

Even in the semiconductor light emitting device A40 of this embodiment, it is possible to suppress an occurrence of defects due to penetration of solder as in the aforementioned embodiments.

Fifth Embodiment

Figure 30:
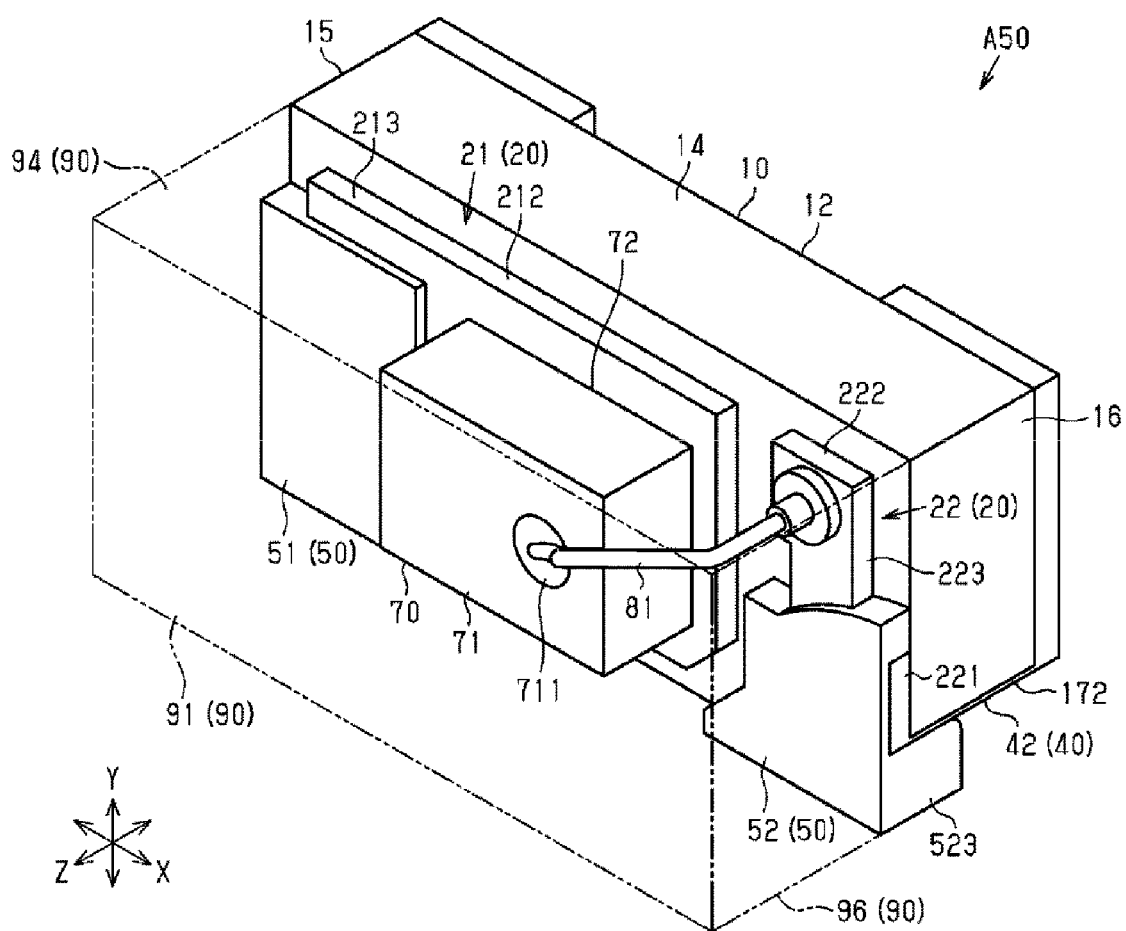
FIG. 30 is a perspective view of a semiconductor light emitting device, when viewed from a front upper right side, according to a fifth embodiment of the present disclosure.
Figure 31:
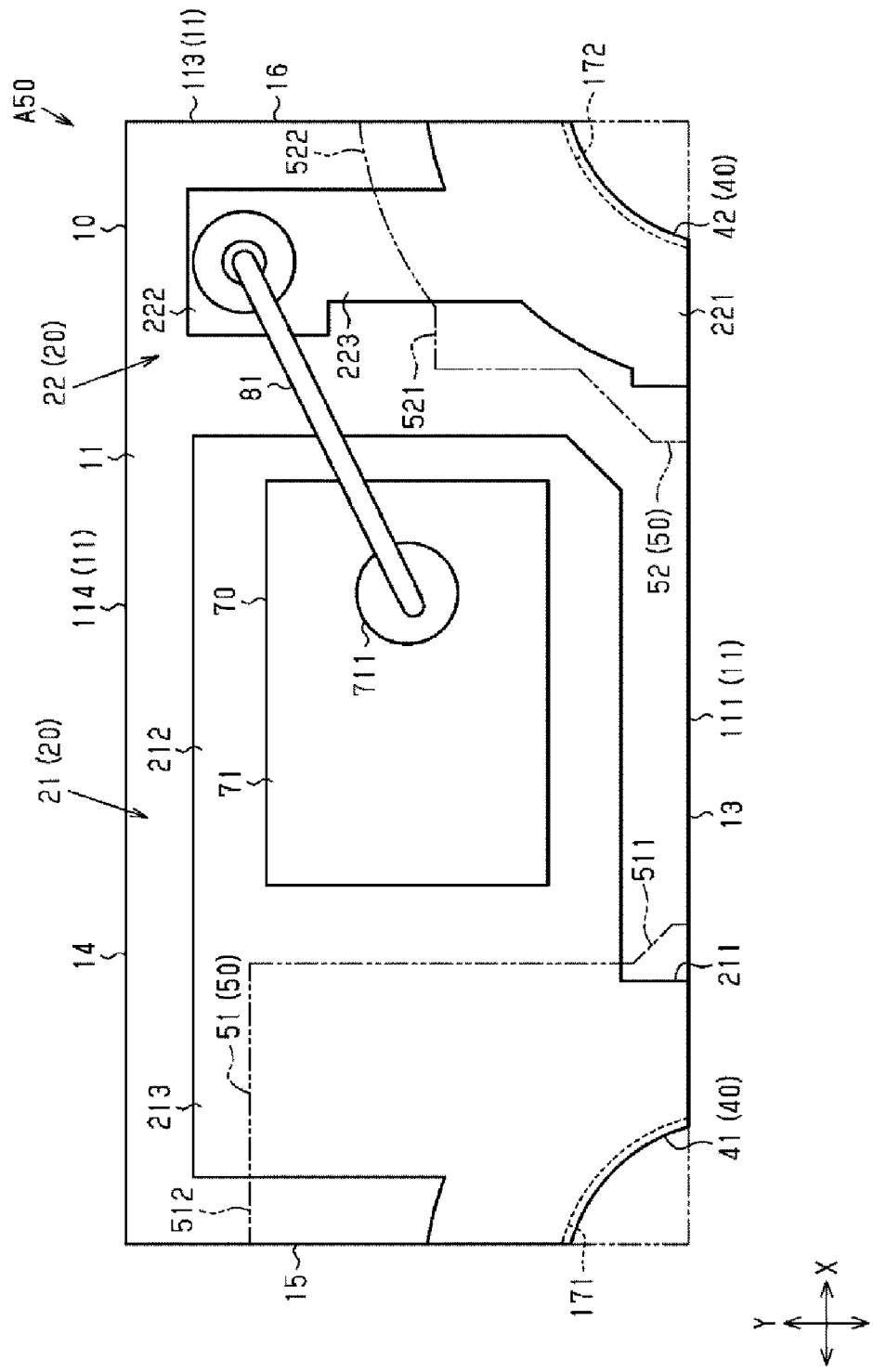
FIG. 31 is a front view of the semiconductor light emitting device according to the fifth embodiment.

Hereinafter, a semiconductor light emitting device of a fifth embodiment of the present disclosure will be described with reference to FIGS. 30 and 31.

In this embodiment, the same constituent members as the aforementioned embodiments are denoted by the same reference numerals or symbols, and explanation thereof will not be repeated. In FIG. 30, a sealing resin is indicated by a two-dot chain line for convenience of understanding. In FIG. 31, the sealing resin is omitted for convenience of understanding.

A semiconductor light emitting device A50 according to this embodiment is different from the first embodiment in terms of the shape of the main surface electrode 20. As shown in FIGS. 30 and 31, the main surface electrode 20 of this embodiment includes a first main surface electrode 21 and a second main surface electrode 22. The first main surface electrode 21 and the second main surface electrode 22 are not in contact with the fourth side 114 (the upper side in FIG. 31) of the main surface 11 of the substrate 10. Specifically, the connection portion 213 of the first main surface electrode 21 extends from the first base portion 211 in the transverse direction of the substrate 10, that is, in the second direction Y. In this embodiment, the upper end of the connection portion 213 in the second direction Y is located at the same position as the upper end of the die pad 212 and is not in contact with the fourth side 114 of the main surface 11 of the substrate 10.

In the wire pad 222 of the second main surface electrode 22, the upper end of the wire pad 222 in the second direction Y is slightly above the upper end of the die pad 212 and is not in contact with the fourth side 114 of the main surface 11 of the substrate 10.

Even in the semiconductor light emitting device A50 of this embodiment, it is possible to suppress an occurrence of defects due to penetration of solder as in the aforementioned embodiments.

Sixth Embodiment

Hereinafter, a semiconductor light emitting device of a sixth embodiment of the present disclosure will be described with reference to FIGS. 32 to 40.

In this embodiment, the same constituent members as the aforementioned embodiments are denoted by the same reference numerals or symbols, and explanation thereof will not be repeated. As shown in FIGS. 32 to 39, a semiconductor light emitting device A60 includes a substrate 10, a main surface electrode 20, a back surface electrode 30, a through electrode 40, a main surface insulating film 50, a back surface insulating film 60, a semiconductor light emitting element 70, a wire 81, and a sealing resin 90. In FIGS. 32 and 36 to 39, the sealing resin is indicated by a two-dot chain line for convenience of understanding. In FIG. 34, for convenience of understanding, the sealing resin is omitted and the main surface insulating film is indicated by a two-dot chain line.

Figure 32:
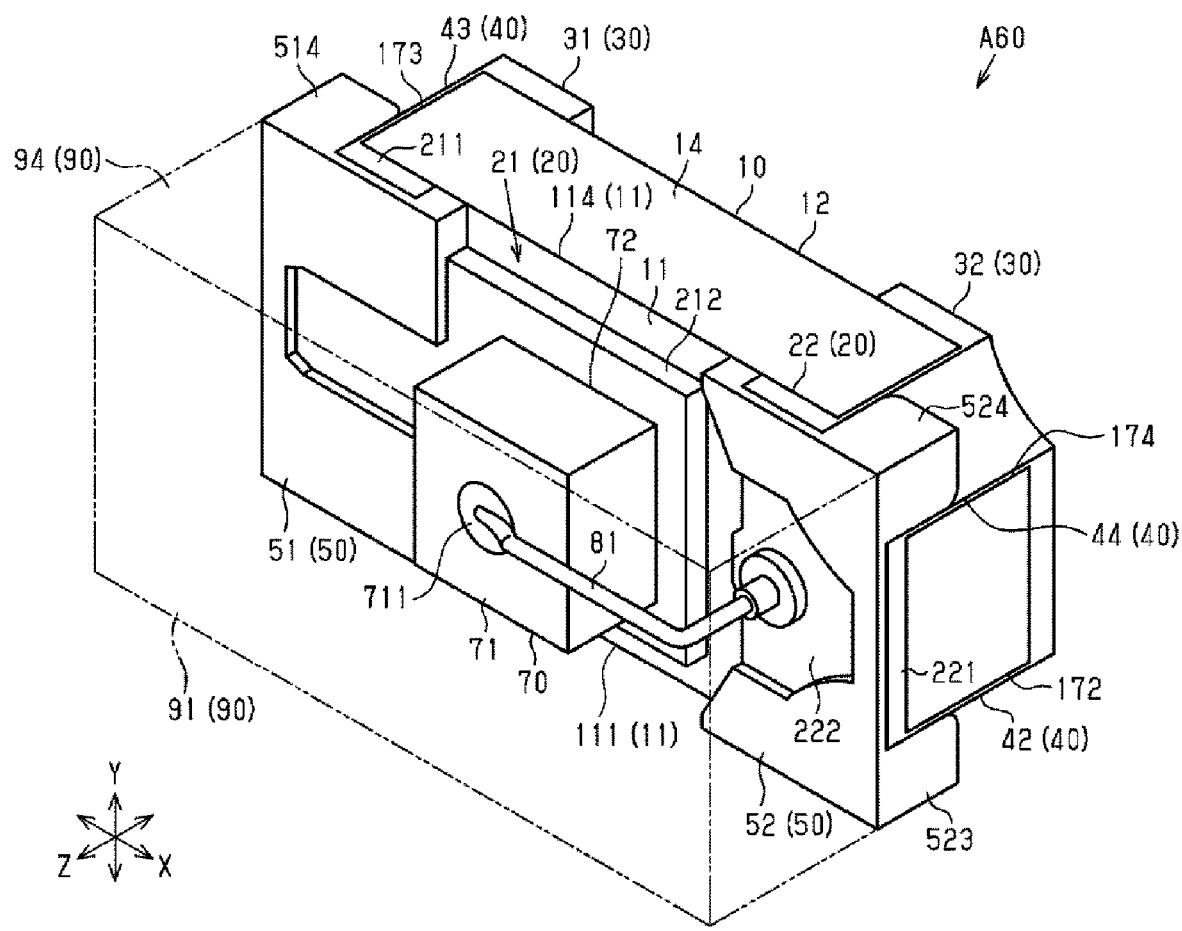
FIG. 32 is a perspective view of a semiconductor light emitting device, when viewed from a front upper right side, according to a sixth embodiment of the present disclosure.
Figure 34:
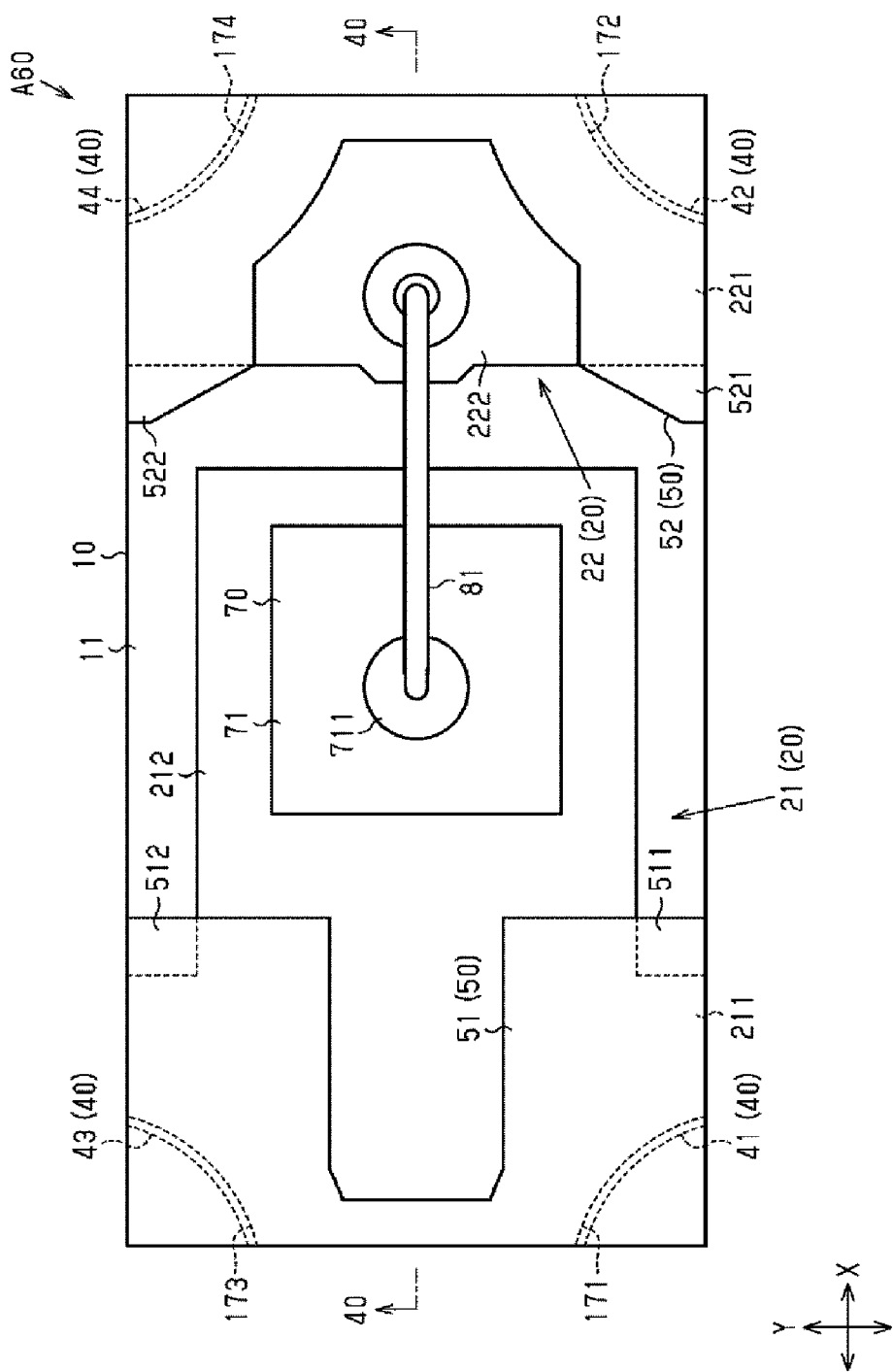
FIG. 34 is a front view of the semiconductor light emitting device according to the sixth embodiment.
Figure 35:
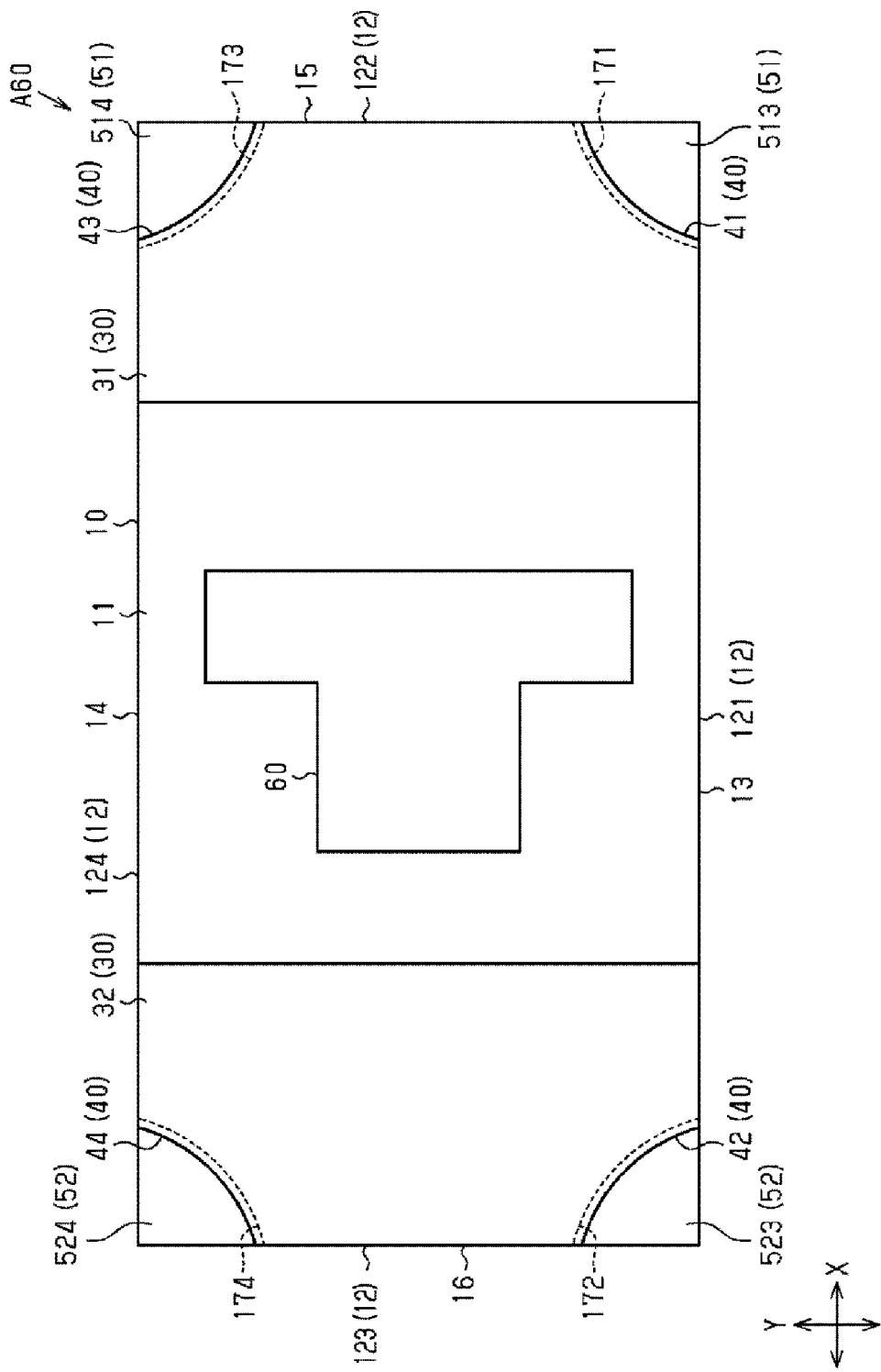
FIG. 35 is a rear view of the semiconductor light emitting device according to the sixth embodiment.

As shown in FIGS. 32 and 34, the shape of the semiconductor light emitting device A60 is rectangular as viewed from the thickness direction Z of the substrate 10 of the semiconductor light emitting device A60. As shown in FIGS. 34 and 35, the substrate 10 includes a first through groove 171, a second through groove 172, a third through groove 173 and a fourth through groove 174.

Figure 36:
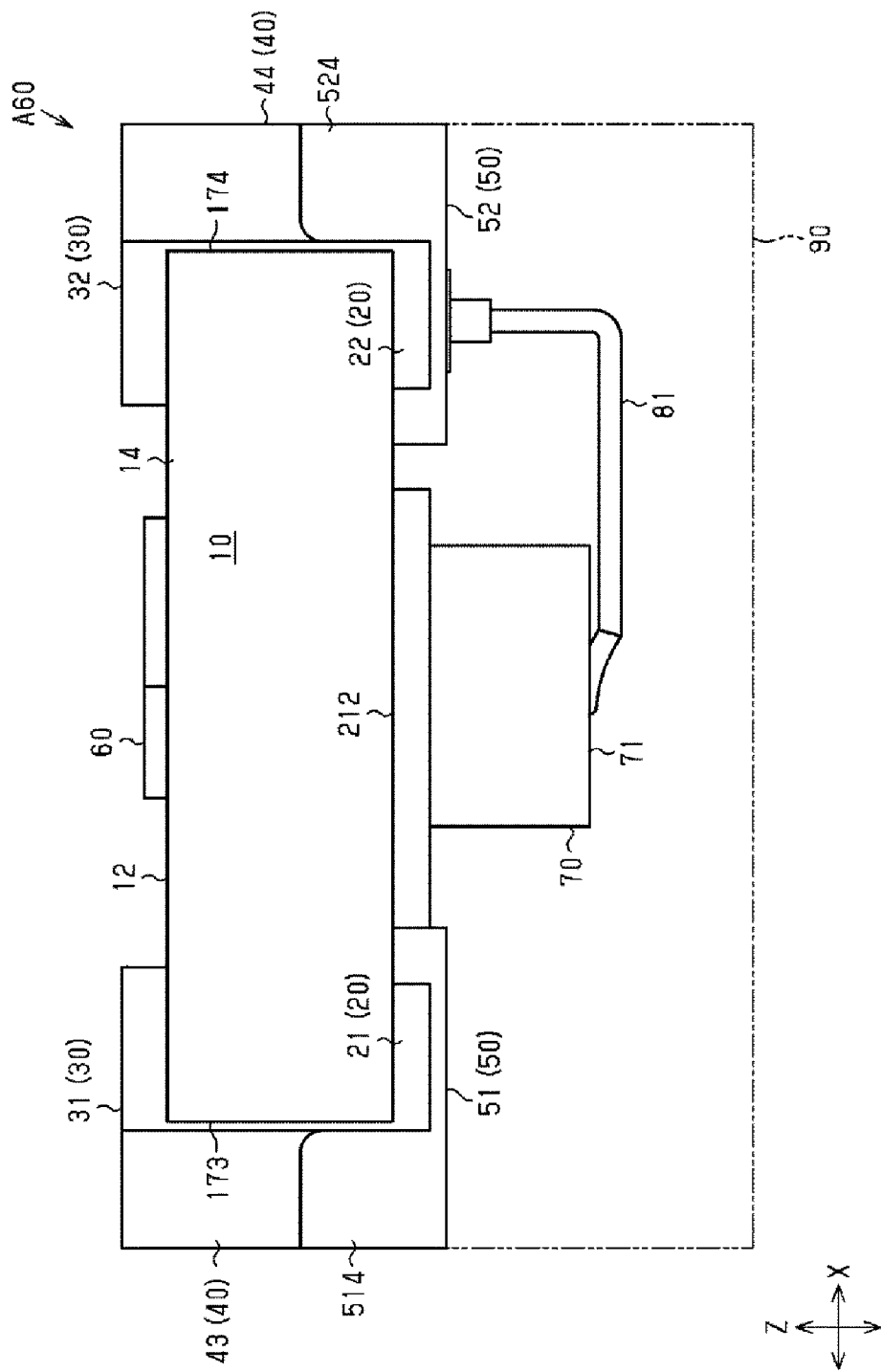
FIG. 36 is a top view of the semiconductor light emitting device according to the sixth embodiment.

As shown in FIG. 34, the first through groove 171 is a portion recessed from the first side surface 15 and the bottom surface 13. The first through groove 171 is connected to the first side 111 and the second side 112 of the main surface 11. As shown in FIG. 36, the first through groove 171 reaches the main surface 11 and the back surface 12 of the substrate 10 in the thickness direction Z. The cross section of the first through groove 171 perpendicular to the thickness direction Z has a quarter circular shape. A first through electrode 41 is disposed in the first through groove 171.

As shown in FIG. 34, the second through groove 172 is a portion recessed from the second side surface 16 and the bottom surface 13. The second through groove 172 is connected to the first side 111 and the third side 113 of the main surface 11. As shown in FIG. 36, the second through groove 172 reaches the main surface 11 and the back surface 12 of the substrate 10 in the thickness direction Z. The cross section of the second through groove 172 perpendicular to the thickness direction Z has a quarter circular shape. A second through electrode 42 is disposed in the second through groove 172.

Figure 37:
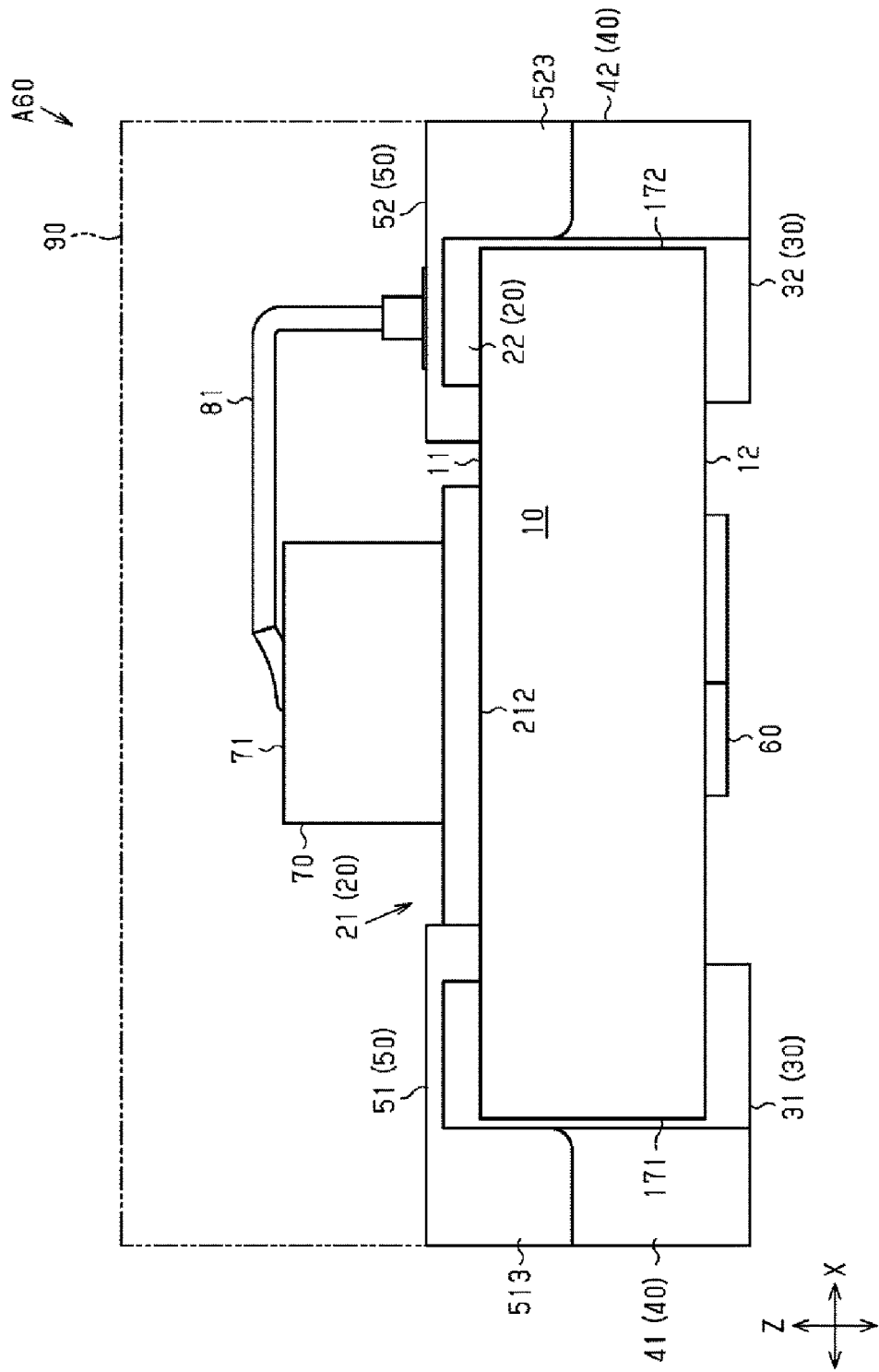
FIG. 37 is a bottom view of the semiconductor light emitting device according to the sixth embodiment.

As shown in FIG. 34, the third through groove 173 is a portion recessed from the first side surface 15 and the top surface 14. The third through groove 173 is connected to the fourth side 114 and the second side 112 of the main surface 11. As shown in FIG. 37, the third through groove 173 reaches the main surface 11 and the back surface 12 of the substrate 10 in the thickness direction Z. The cross section of the third through groove 173 perpendicular to the thickness direction Z has a quarter circular shape. A third through electrode 43 is disposed in the third through groove 173.

As shown in FIG. 34, the fourth through groove 174 is a portion recessed from the second side surface 16 and the top surface 14. The fourth through groove 174 is connected to the fourth side 114 and the third side 113 of the main surface 11. As shown in FIG. 37, the fourth through groove 174 reaches the main surface 11 and the back surface 12 of the substrate 10 in the thickness direction Z. The cross section of the fourth through groove 174 perpendicular to the thickness direction Z has a quarter circular shape. A fourth through electrode 44 is disposed in the fourth through groove 174.

As shown in FIG. 34, the main surface electrode 20 includes a first main surface electrode 21 and a second main surface electrode 22. The first main surface electrode 21 includes a first base portion 211 and a die pad 212.

The first base portion 211 is a portion in contact with the first side 111 on the side of the bottom surface 13 of the substrate 10, the second side 112 on the first side surface 15 side of the substrate 10, and the fourth side 114 on the side of the top surface 14 of the substrate 10. In this embodiment, the first base portion 211 includes two notches having a circular shape with a central angle of 90 degrees (quarter circular shape). The inner edge of each of the notches intersects the first through groove 171 connected to the first side 111 and the second side 112 of the main surface 11 and the third through groove 173 connected to the second side 112 and the fourth side 114 of the main surface 11. The first base portion 211 of this embodiment corresponds to a U-shaped portion in contact with the first side 111, the second side 112, and the fourth side 114 of the main surface 11 of the substrate 10.

The second main surface electrode 22 includes a second base portion 221 and a wire pad 222. The second base portion 221 is a portion in contact with the first side 111 on the side of the bottom surface 13 of the substrate 10, the third side 113 on the side of the second side surface 16 of the substrate 10, and the fourth side 114 on the side of the top surface 14 of the substrate 10. In this embodiment, the second base portion 221 includes two notches having a circular shape with a central angle of 90 degrees (quarter circular shape). The inner edge of each of the notches intersects the second through groove 172 connected to the first side 111 and the third side 113 of the main surface 11 and the fourth through groove 174 connected to the third side 113 and the fourth side 114 of the main surface 11. The second base portion 221 of this embodiment corresponds to a U-shaped portion in contact with the first side 111, the third side 112, and the fourth side 114 of the main surface 11 of the substrate 10.

The wire pad 222 is interposed between a portion in contact with the first side 111 and a portion in contact with the fourth side 114 in the second base portion 221. The semiconductor light emitting element 70 is, for example, a light emitting diode (LED) element. The semiconductor light emitting element 70 may be a light emitting element such as an LD. As shown in FIG. 34, the semiconductor light emitting element 70 has a square shape as viewed from the thickness direction Z.

Figure 33:
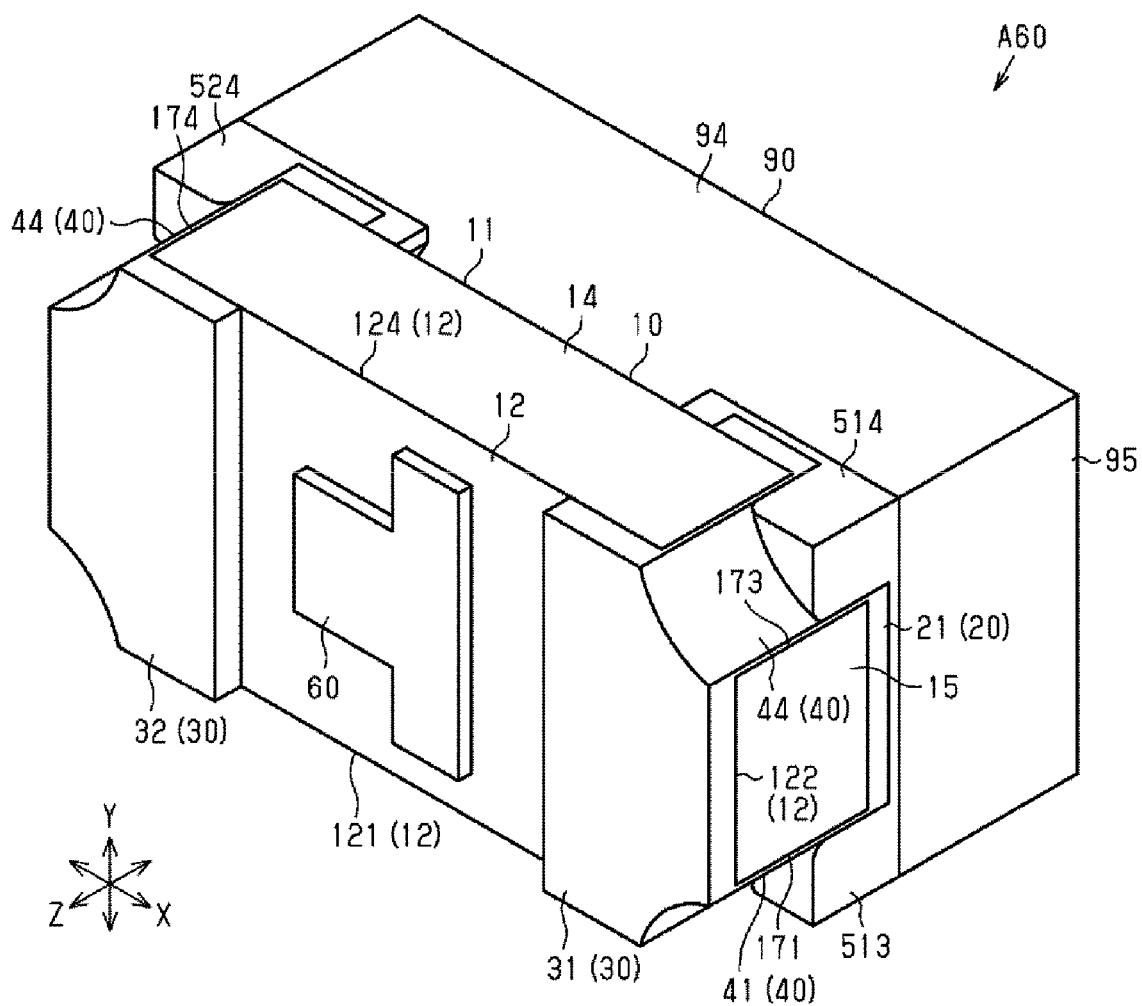
FIG. 33 is a perspective view of the semiconductor light emitting device, when viewed from a rear upper left side, according to the sixth embodiment.

As shown in FIGS. 33 and 35, the back surface electrode 30 includes a first back surface electrode 31 and a second back surface electrode 32. As shown in FIG. 35, the first back surface electrode 31 is in contact with the first side 121, the second side 122, and the fourth side 124 on the back surface 12 of the substrate 10. A portion of the edge of the first back surface electrode 31 intersects the first through groove 171 and the third through groove 173. The second back surface electrode 32 is in contact with the first side 121, the third side 123, and the fourth side 124 on the back surface 12 of the substrate 10. A portion of the edge of the second back surface electrode 32 intersects the second through groove 172 and the fourth through groove 174.

As shown in FIGS. 34 and 35, the first through electrode 41 is disposed along the inner wall of the first through groove 171. The second through electrode 42 is disposed along the inner wall of the second through groove 172. The third through electrode 43 is disposed along an inner wall of the third through groove 173. The fourth through electrode 44 is disposed along the inner wall of an fourth through groove 174.

As shown in FIG. 37, the first through electrode 41 extends to the main surface 11 of the substrate 10 and is in contact with the first main surface electrode 21 of the main surface 11. In addition, the first through electrode 41 extends to the back surface 12 of the substrate 10 and is in contact with the first back surface electrode 31 of the back surface 12. The second through electrode 42 extends to the main surface 11 of the substrate 10 and is in contact with the second main surface electrode 22 of the main surface 11. Further, the second through electrode 42 extends to the back surface 12 of the substrate 10 and is in contact with the second back surface electrode 32 of the back surface 12.

As shown in FIG. 36, the third through electrode 43 extends to the main surface 11 of the substrate 10 and is in contact with the first main surface electrode 21 of the main surface 11. In addition, the third through electrode 43 extends to the back surface 12 of the substrate 10 and is in contact with the first back surface electrode 31 of the back surface 12. The fourth through electrode 44 extends to the main surface 11 of the substrate 10 and is in contact with the second main surface electrode 22 of the main surface 11. Further, the fourth through electrode 44 extends to the back surface 12 of the substrate 10 and is in contact with the second back surface electrode 32 of the back surface 12.

Figure 39:
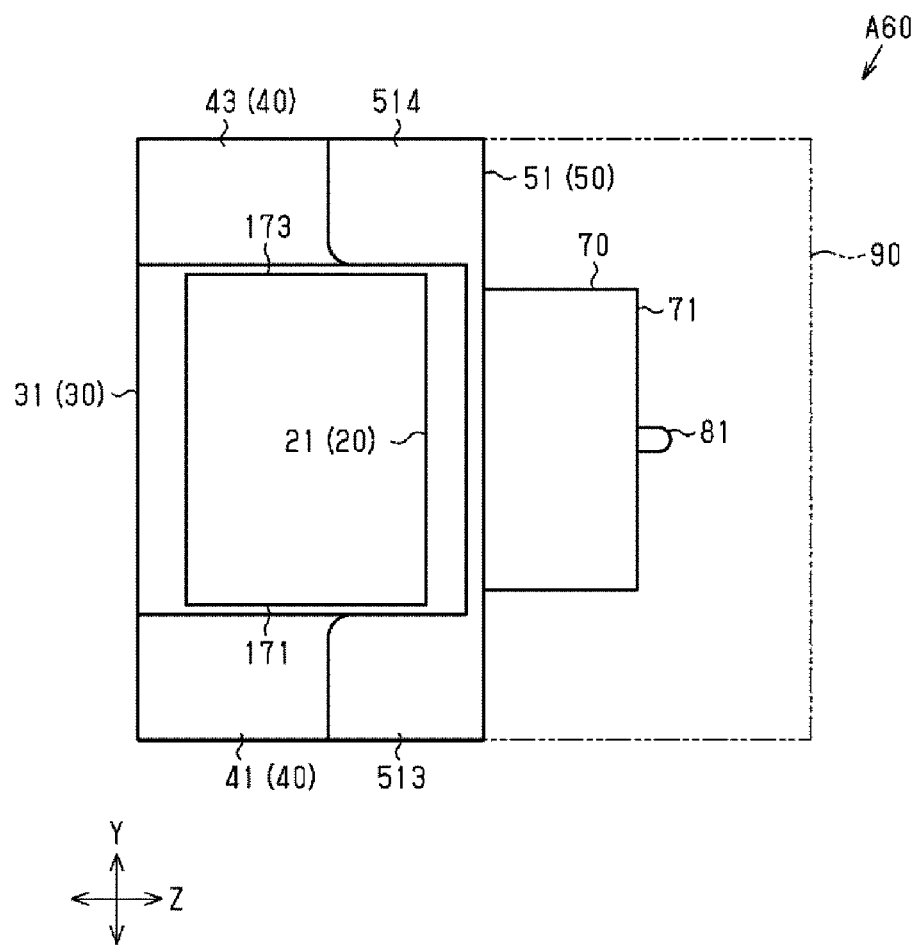
FIG. 39 is a left side view of the semiconductor light emitting device according to the sixth embodiment.
Figure 40:
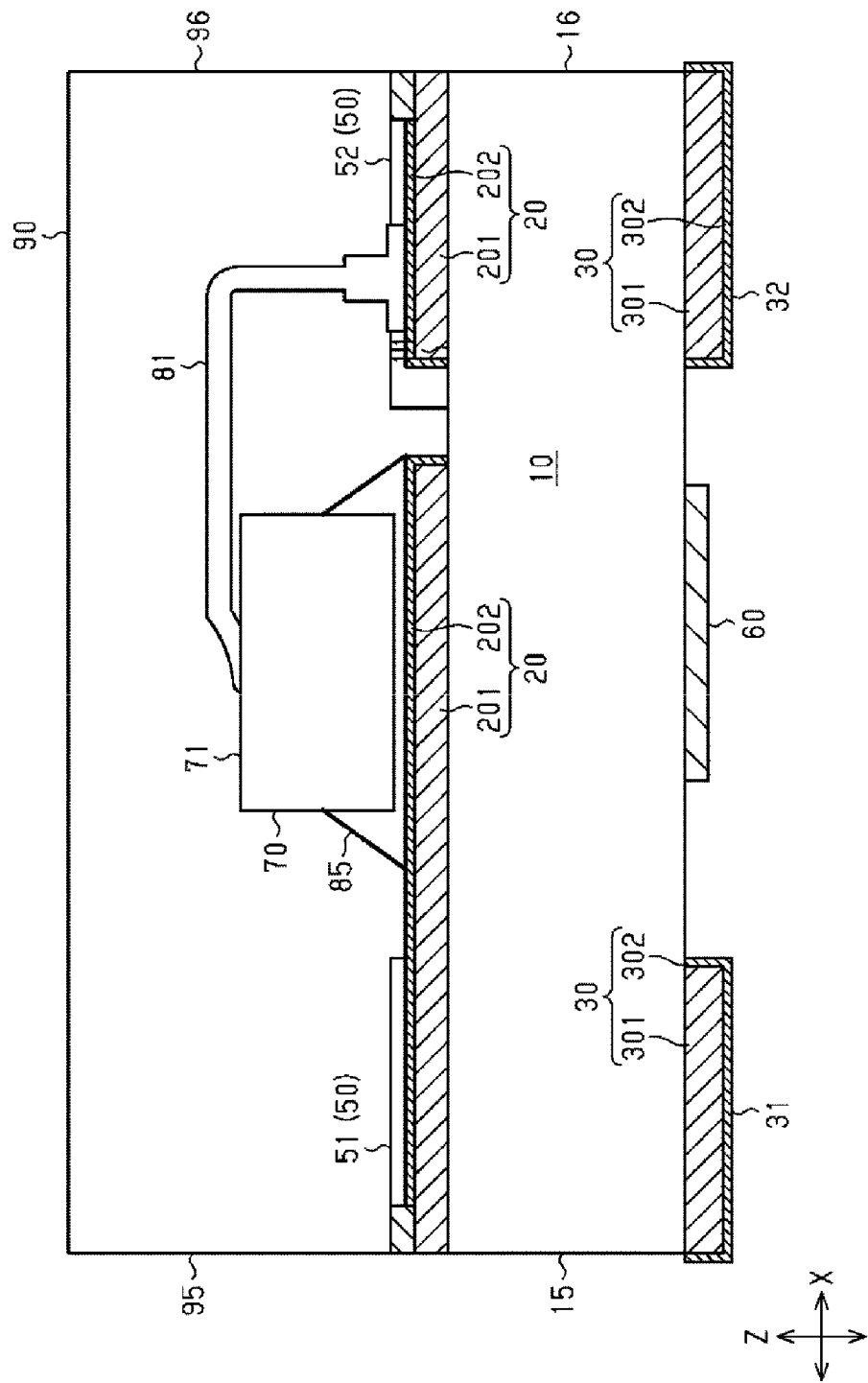
FIG. 40 is a cross-sectional view taken along a line 40-40 in FIG. 34.

As shown in FIG. 34, the main surface insulating film 50 includes a first insulating film 51 covering a portion of the first main surface electrode 21, and a second insulating film 52 covering a portion of the second main surface electrode 22. The first insulating film 51 covers the entire surface of the first base portion 211 of the first main surface electrode 21 and is in contact with the first side 111 and the fourth side 114 across the first main surface electrode 21. In addition, as shown in FIG. 39, the first insulating film 51 of this embodiment includes a resin portion 513 that enters the first through groove 171 and a resin portion 514 that enters the third through groove 173.

Figure 38:
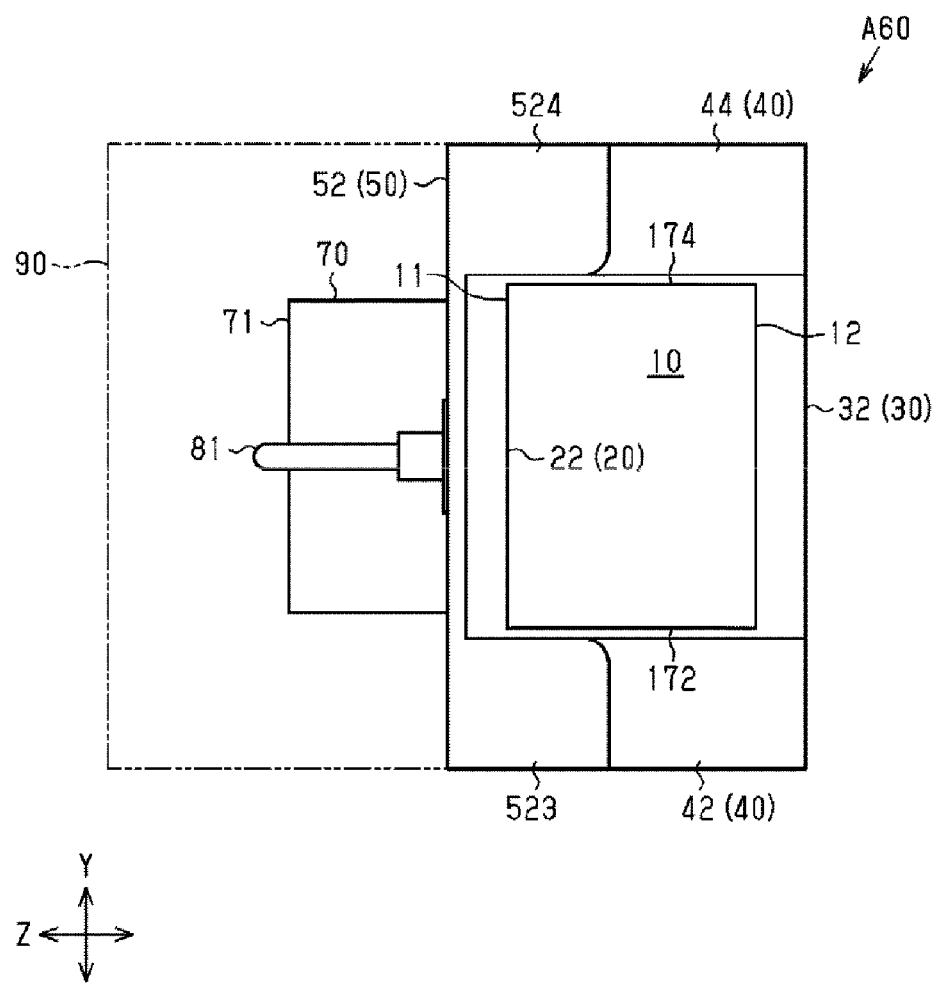
FIG. 38 is a right side view of the semiconductor light emitting device according to the sixth embodiment.

The second insulating film 52 covers the entire surface of the second base portion 221 of the second main surface electrode 22 and is in contact with the first side 111 and the fourth side 114 across the second main surface electrode 22. In addition, as shown in FIG. 38, the second insulating film 52 of this embodiment includes a resin portion 523 that enters the second through groove 172 and a resin portion 524 that enters the fourth through groove 174.

In the semiconductor light emitting device A60 of this embodiment, the first main surface electrode 21 and the second main surface electrode 22 are covered with the first insulating film 51 and the second insulating film 52. Therefore, as in the aforementioned embodiments, the solder P20 used for mounting is prevented from penetrating into the semiconductor light emitting device A60, thereby suppressing an occurrence of defects.

In addition, the semiconductor light emitting device A60 of this embodiment may be mounted with the bottom surface 13 shown in FIG. 34 facing the circuit board P10, that is, on the circuit board P10 using the first through electrode 41 and the second through electrode 42. Further, the semiconductor light emitting device A60 of this embodiment may be mounted with the top surface 14 shown in FIG. 34 facing the circuit board P10, that is, on the circuit board P10 using the third through electrode 43 and the fourth through electrode 44. Therefore, the circuit board has an increased degree of freedom in the arrangement of pads with respect to the direction of light emitted from the mounted semiconductor light emitting device A60, that is, an increased degree of freedom for designing the circuit board.

(Modification of Sixth Embodiment)

Figure 41:
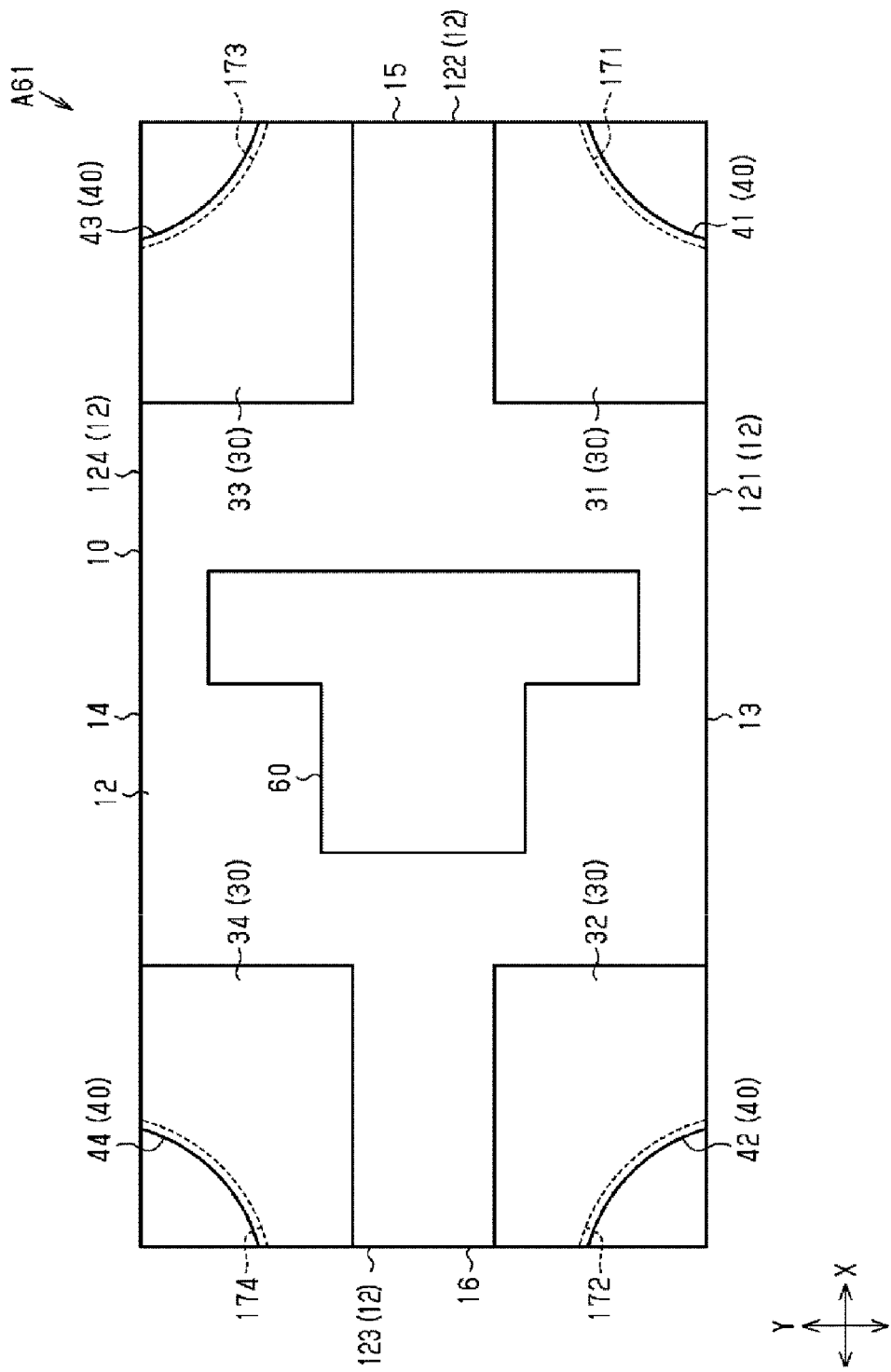
FIG. 41 is a rear view of a semiconductor light emitting device according to a modification of the sixth embodiment.

As shown in FIG. 41, a semiconductor light emitting device A61 includes a first back surface electrode 31, a second back surface electrode 32, a third back surface electrode 33, and a fourth back surface electrode 34 corresponding to the first through electrode 41, the second through electrode 42, the third through electrode 43, and the fourth through electrode 44, respectively. In this way, by reducing the height of the first back surface electrode 31 to the fourth back surface electrode 34, the fillet P21 formed by the solder P20 when the semiconductor light emitting device A61 is mounted on the circuit board P10 by the solder P20 is reduced, and accordingly, the semiconductor light emitting device A61 can be stably mounted on the circuit board P10 without suppressing the semiconductor light emitting device A61.

(Other Modifications)

A semiconductor light emitting device including a plurality of semiconductor light emitting elements mounted thereon may be used for the aforementioned embodiments and modifications.

A back surface electrode may be omitted for the aforementioned embodiments and modifications.

A back surface insulating film may be omitted for the aforementioned embodiments and modifications.

The aforementioned embodiments and modifications may be suitably combined.

The semiconductor light emitting device according to the present disclosure is not limited to the aforementioned embodiments and modifications. The specific configuration of each part of the semiconductor light emitting device according to the present disclosure can be varied in design in various ways.

According to the present disclosure in some embodiments, it is possible to provide a semiconductor light emitting device capable of suppressing an occurrence of defects due to solder penetration.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light emitting device comprising:
   a substrate including:
   a first surface and a second surface facing opposite sides in a thickness direction of the substrate,
   a first side surface and a second side surface facing opposite sides in a first direction perpendicular to the thickness direction, a third side surface and a fourth side surface facing opposite sides in a second direction perpendicular to the thickness direction and the first direction, a first recessed portion connecting the first side surface and the third side surface and recessed when seen in the thickness direction, and a second recessed portion connecting the second side surface and the third side surface and recessed when seen in the thickness direction;

a first electrode disposed on the first surface, the first recessed portion, and the second surface;

a second electrode disposed on the first surface, the second recessed portion, and the second surface, and being separate from the first electrode;

a light emitting element disposed on the first electrode;

a wire connecting the light emitting element and the second electrode;

a light-transmitting resin covering the light emitting element and the wire;

a first covering member disposed from a portion of the first electrode disposed on the first surface of the substrate to the first surface of the substrate; and a second covering member disposed from a portion of the second electrode disposed on the first surface of the substrate to the first surface of the substrate.

2. The semiconductor light emitting device of claim 1, wherein the first covering member overlaps at least a part of the first recessed portion when seen in the first direction.

3. The semiconductor light emitting device of claim 1, wherein the second covering member overlaps at least a part of the second recessed portion when seen in the first direction.

4. The semiconductor light emitting device of claim 1, wherein the first covering member overlaps at least a part of the first recessed portion when seen in the second direction.

5. The semiconductor light emitting device of claim 1, wherein the second covering member overlaps at least a part of the second recessed portion when seen in the second direction.

6. The semiconductor light emitting device of claim 1, wherein a portion of the wire connected to the second electrode is positioned to be closer to the fourth side surface than the third side surface.

7. The semiconductor light emitting device of claim 1, wherein a portion of the first electrode formed on the second surface and a portion of the second electrode formed on the second surface are non-rectangular when seen in the thickness direction.

8. The semiconductor light emitting device of claim 1, wherein the light-transmitting resin and the first covering member include end surfaces that are flush with the first side surface.

9. The semiconductor light emitting device of claim 1, wherein the light-transmitting resin and the second covering member include end surfaces that are flush with the second side surface.

10. The semiconductor light emitting device of claim 1, wherein the light-transmitting resin, the first covering member, and the second covering member include end surfaces that are flush with the third side surface.

11. The semiconductor light emitting device of claim 1, wherein the first electrode is exposed from the light-transmitting resin in a direction that the fourth side surface faces.

12. The semiconductor light emitting device of claim 1, wherein the second electrode is exposed from the light-transmitting resin in a direction that the fourth side surface faces.

* * * * *